(12) United States Patent
Lai

(10) Patent No.: US 12,476,133 B2
(45) Date of Patent: Nov. 18, 2025

(54) SEMICONDUCTOR STRUCTURE AND METHOD FOR MANUFACTURING THE SAME

(71) Applicant: Taiwan Semiconductor Manufacturing Company, Ltd., Hsinchu (TW)

(72) Inventor: Yao-Hsuan Lai, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 681 days.

(21) Appl. No.: 17/571,930

(22) Filed: Jan. 10, 2022

(65) Prior Publication Data
US 2023/0245920 A1    Aug. 3, 2023

(51) Int. Cl.
| | |
|---|---|
| *H10D 30/67* | (2025.01) |
| *H01L 21/762* | (2006.01) |
| *H10D 30/01* | (2025.01) |
| *H10D 84/83* | (2025.01) |
| *H01L 21/311* | (2006.01) |

(52) U.S. Cl.
CPC ..... *H01L 21/76224* (2013.01); *H10D 30/031* (2025.01); *H10D 84/83* (2025.01); *H01L 21/31111* (2013.01); *H01L 21/31116* (2013.01); *H10D 30/6735* (2025.01); *H10D 30/6757* (2025.01)

(58) Field of Classification Search
None
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0287971 A1* | 9/2019 | Lee .................. H01L 29/66795 |
| 2021/0305420 A1* | 9/2021 | Frougier ........... H01L 29/66795 |

* cited by examiner

*Primary Examiner* — Benjamin P Sandvik
(74) *Attorney, Agent, or Firm* — McClure, Qualey & Rodack, LLP

(57) ABSTRACT

A semiconductor device includes a fin structure protruded from a substrate, nanostructures over the fin structure, and an isolation structure arranged adjacent to the fin structure. The isolation structure includes a dielectric material, a doped oxide layer on sidewalls and a bottom surface of the dielectric material, and an oxide layer on sidewalls and a bottom surface of the doped oxide layer. The semiconductor device further includes an isolation feature over the isolation structure and a gate structure over the fin structure and the isolation structure. The gate structure wraps around the nanostructures and is in contact with the isolation feature.

20 Claims, 25 Drawing Sheets

SEMICONDUCTOR STRUCTURE AND METHOD FOR MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) devices have been incorporated into memory devices (including, for example, static random-access memory, or SRAM, cells) and core devices (including, for example, standard logic, or STD, cells) to reduce chip footprint while maintaining reasonable processing margins. However, as GAA devices continue to be scaled down, conventional methods for manufacturing GAA devices may experience challenges. Accordingly, although existing technologies for fabricating GAA devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1C, 1D, 1E, 1F, 1G, 1H, 1I, 1J, 1K, 1L, 1M, 1N-1, 1O, 1P, 1Q and 1R are cross-sectional views of an embodiment of a workpiece of the present disclosure constructed at various fabrication stages along line A-A' of FIG. 1B, in accordance with some embodiments.

FIG. 1N-2 is a cross-sectional view of an embodiment of a workpiece of the present disclosure along line B-B' of FIG. 1N-1, in accordance with some embodiments.

FIG. 1N-3 is a cross-sectional view of an embodiment of a workpiece of the present disclosure along line C-C' of FIG. 1N-2, in accordance with some embodiments.

DETAILED DESCRIPTION

Figure 1A:
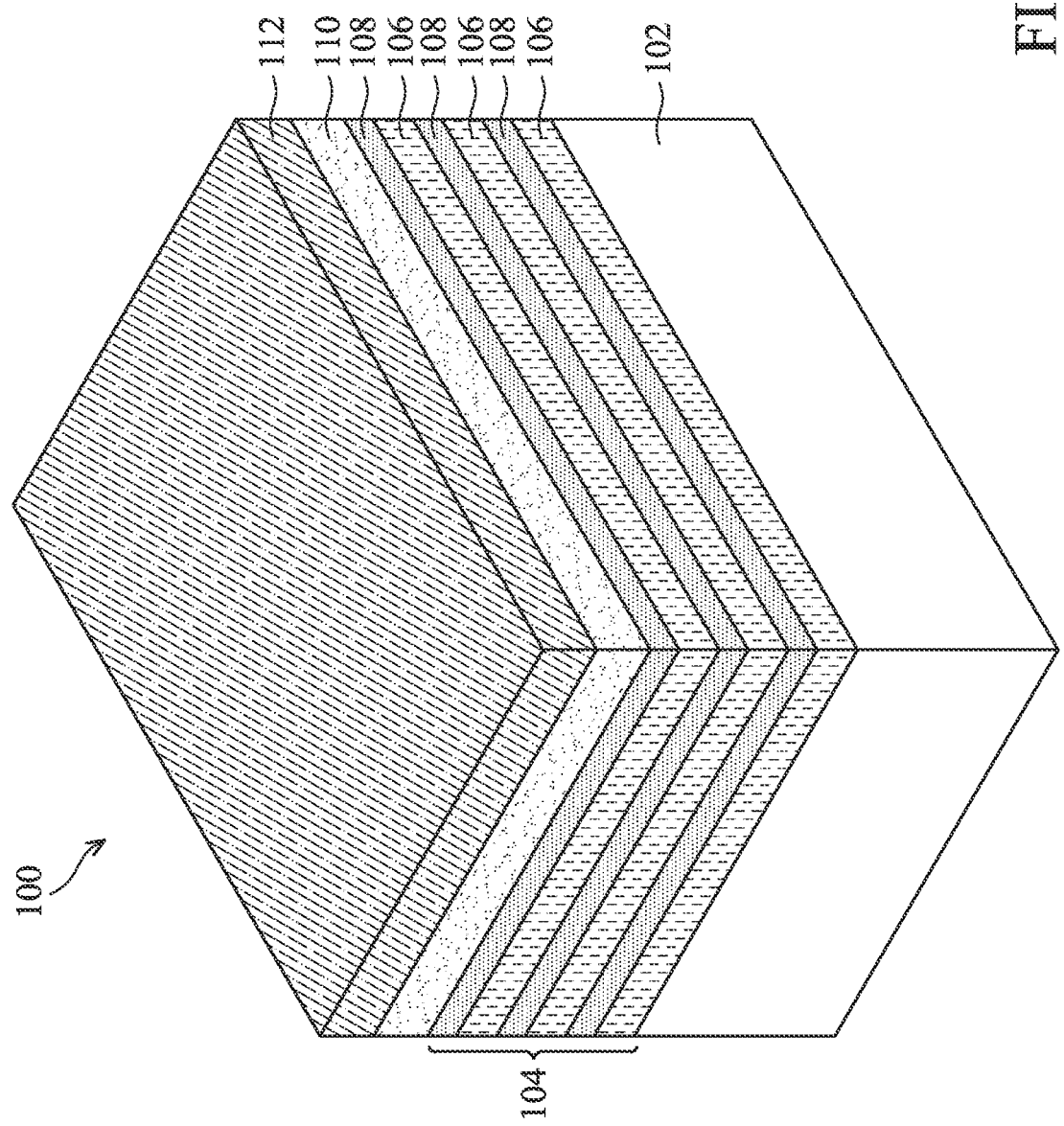
FIGS. 1A and 1B are isometric views of an embodiment of a workpiece of the present disclosure constructed at various fabrication stages, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as three-dimensional gate-all-around (GAA) FETs, in an integrated circuit (IC) structure. Generally, a GAA FET may include a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including an isolation structure having a liner layer with a bilayer scheme. The details of the structure and fabrication methods of the present disclosure are described below in conjunction with the accompanying drawings, which illustrate the process of making GAA devices, according to some embodiments.

During the manufacturing of GAA device, the isolation structure (e.g., shallow trench isolation (STI)) is used for isolating the GAA device from other devices. The formation of the isolation structure may include depositing a material for a liner layer and a dielectric material over and between the material. Then, the material and the dielectric material are recessed to form the isolation structure. The resultant isolation structure may have a concave surface. More specifically, sharp portions (or corners) of the isolation structure close to (or on) sidewalls of fins for forming active region of the GAA device may be higher than middle portion of the isolation structure. Such sharp portions may cause defects in the GAA device. Improved structures for avoiding such concave surface of the isolation structure are needed.

Referring to FIGS. 1A, a workpiece 100 is provided. As shown in FIGS. 1A, the workpiece 100 includes a substrate 102 and a stack 104 over the substrate 102. In some embodiments, the substrate 102 contains a semiconductor material, such as bulk silicon (Si). In some other embodiments, the substrate 102 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 102 may also include an insulating layer, such as a silicon oxide layer, to have a silicon-on-insulator (SOI) structure or a germanium-on-insulator (GOI) structure. In some embodiments, the substrate 102 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion. In some embodiments, n-type wells have an n-type dopant concentration of about $5 \times 10^{16}$ cm$^{-3}$ to about $5 \times 10^{19}$ cm$^{-3}$, and p-type wells have a p-type dopant concentration of about $5 \times 10^{16}$ cm$^{-3}$ to about $5 \times 10^{19}$ cm$^{-3}$.

The stack 104 includes semiconductor layers 106 and 108, and the semiconductor layers 106 and 108 are alternatingly stacked in the Z-direction. The semiconductor layers 106 and the semiconductor layers 108 may have different semiconductor compositions. In some embodiments, semiconductor layers 106 are formed of silicon germanium (SiGe) and the semiconductor layers 108 are formed of silicon (Si). In these embodiments, the additional germanium content in the semiconductor layers 106 allow selective removal or recess of the semiconductor layers 108 without substantial damages to the semiconductor layers 106, so that the semiconductor layers 106 are also referred to as sacrificial layers. In some embodiments, the semiconductor layers 106 and 108 are epitaxially grown over (on) the substrate 102 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized. The semiconductor layers 106 and the semiconductor layers 108 are deposited alternatingly, one-after-another, to form the stack 104. It should be noted that three (3) layers of the semiconductor layers 106 and three (3) layers of the semiconductor layers 108 are alternately and vertically arranged (or stacked) as shown in FIG. 1A, which are for illustrative purposes only and not intended to be limiting beyond what is specifically recited in the claims. The number of layers depends on the desired number of channels members for the semiconductor device. In some embodiments, there may be from 2 to 10 semiconductor layers 106 alternating with 2 to 10 semiconductor layers 108 in the stack 104. For patterning purposes, the workpiece 100 may also include hard mask layers 110 and 112 over the stack 104. In some other embodiments, the hard mask layer 110 includes a silicon germanium layer and the hard mask layer 112 includes a silicon nitride layer over the hard mask layers 110.

Figure 1B:
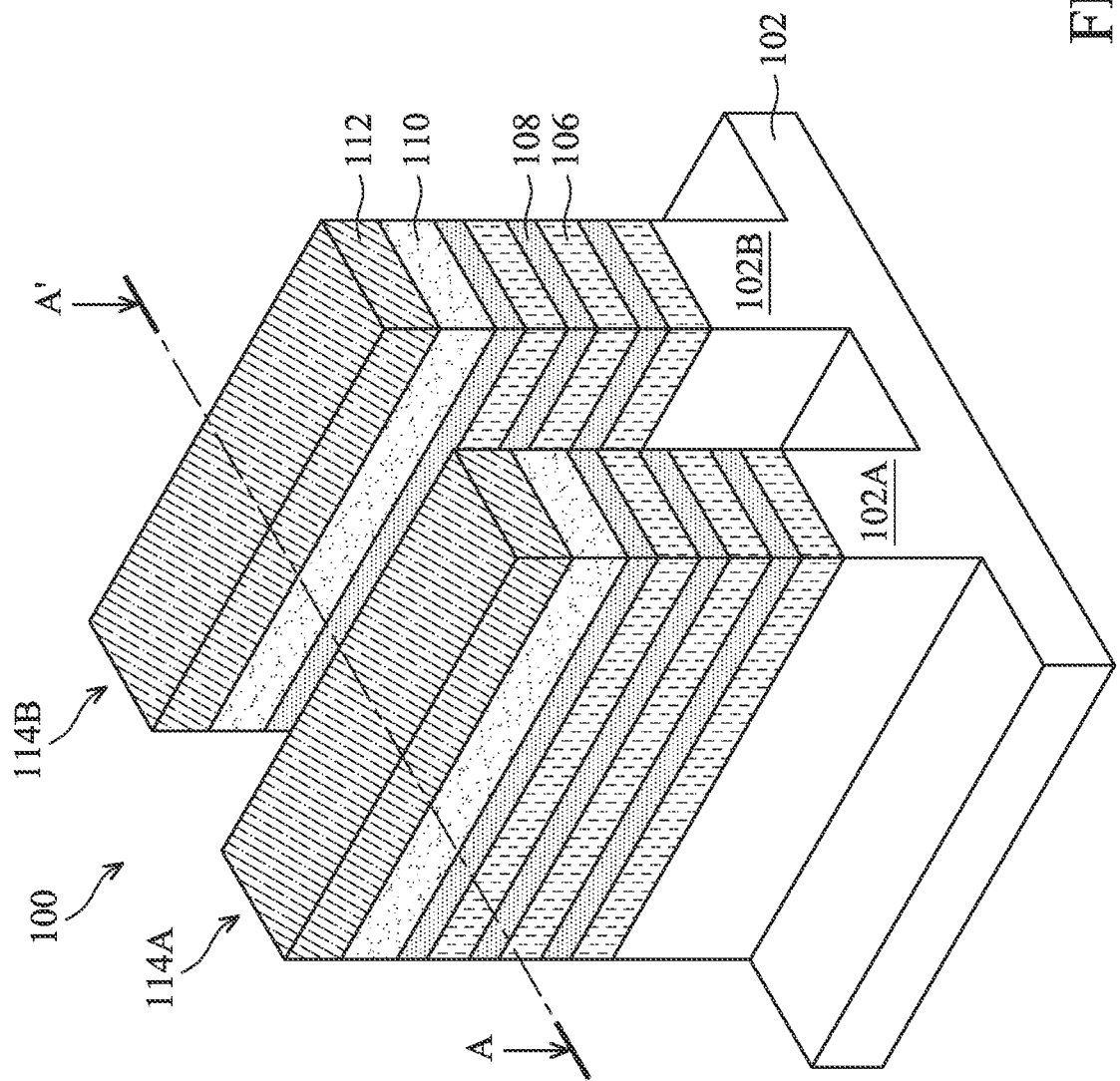

Referring to FIG. 1B, the substrate 102, the stack 104 and the hard mask layers 110 and 112 are then patterned to form fins 114A and 114B (may be collectively referred to as fins 114) over the substrate 102. As shown in FIG. 1B, each of the fins 109 includes a fin structure (102A and 102B) formed from a portion of the substrate 102 and a stack portion formed from the stack 104 over the base portion. The fin structures 102A and 102B are protruded from the substrate 102. Each of the fins 114 extends lengthwise in the X-direction and extends vertically in the Z-direction over the substrate 104. In some embodiments, widths of the fins 114 along the Y-direction are the same. Although the two fins 114A and 114B are formed herein, more fins may be formed, such as three or more fins.

The fins 114 may be patterned using suitable processes including double-patterning or multi-patterning processes. For example, in some embodiments, a material layer is formed over a substrate and patterned using a photolithography process. Spacers are formed alongside the patterned material layer using a self-aligned process. The material layer is then removed, and the remaining spacers, or mandrels, may then be used to pattern the fins 114 by etching the stack 104 and the substrate 102. The etching process may include dry etching, wet etching, reactive ion etching (RIE), and/or other suitable processes.

Figure 1C:
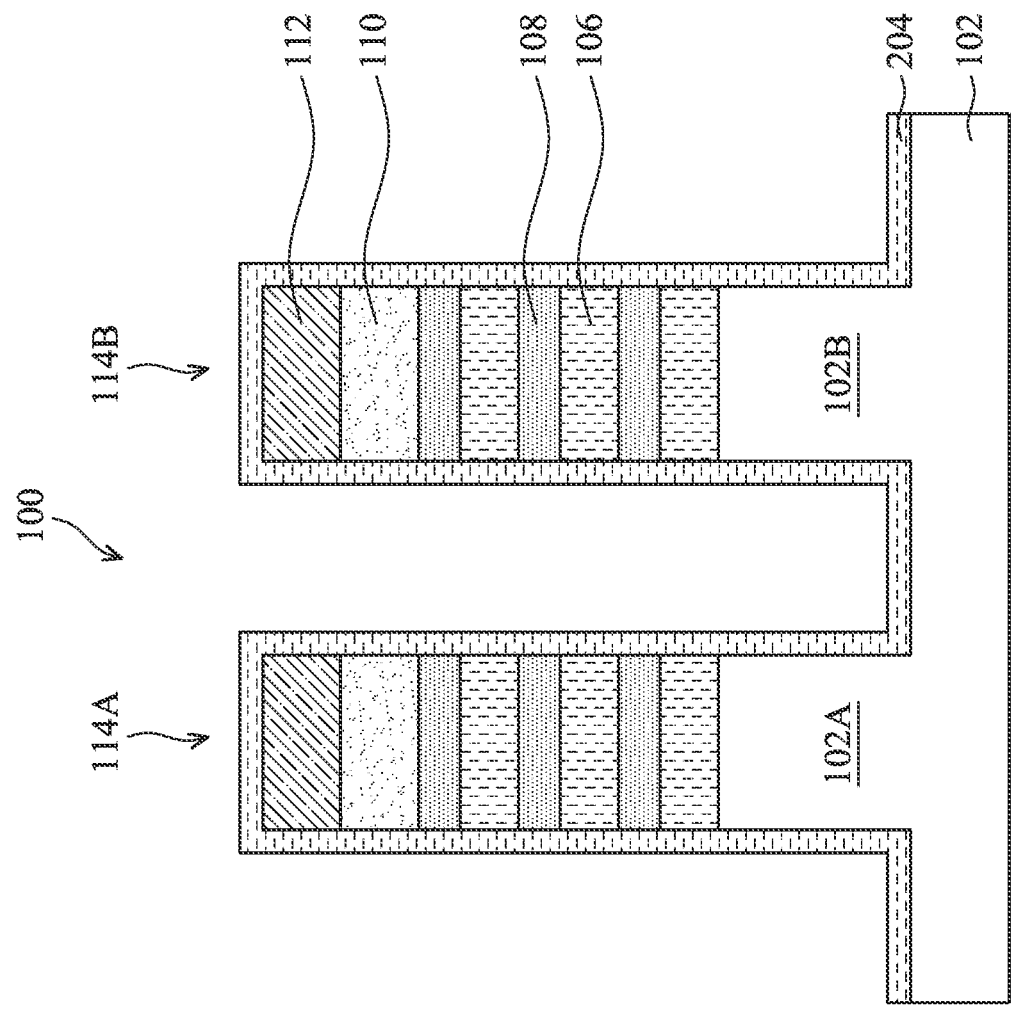
Figure 1D:
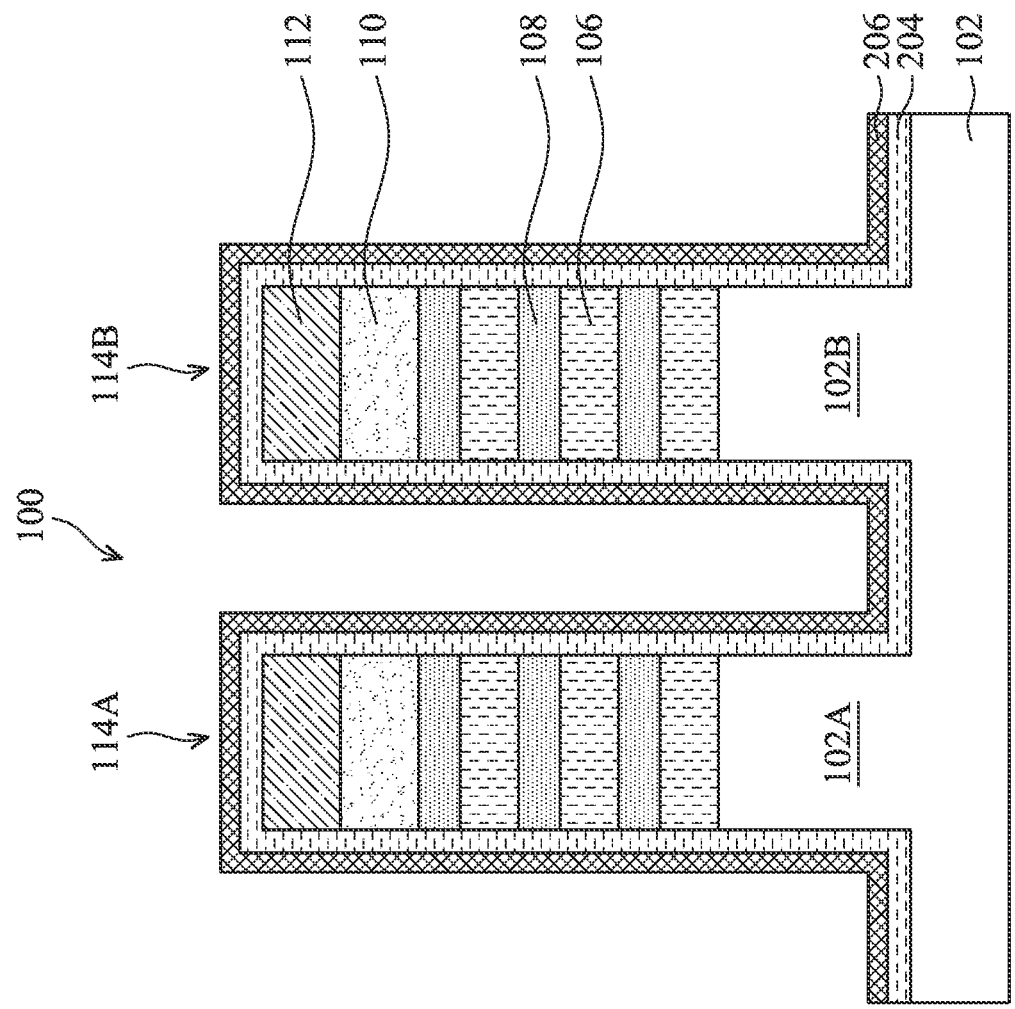

Referring to FIGS. 1C to 1F, isolation structures 202 are formed. Each of the isolation structures 202 are formed form a liner layer 204, a liner layer 206, and dielectric material 208. Specifically, after the fins 114 are formed, the liner layer 204 is conformally formed on sidewalls of the fins 114 and over the fins 114 and the substrate 102, as shown in FIG. 1C. Then, the liner layer 206 is conformally formed on sidewalls of the liner layer 204 and over the liner layer 204, as shown in FIG. 1D. In some embodiments, the liner layers 204 and 206 include silicon oxide. Therefore, the liner layers 204 and 206 may also be referred to as silicon oxide layers, oxide layers or liner oxide layers. In some embodiments, the liner layer 204 and 206 have the same thickness in a range from about 2 nm to about 5 nm, such as 4 nm. In order to form high quality liner layers 204 and 206, the liner layers 204 and 206 are formed by performing atomic layer deposition (ALD) processes.

As discussed above, in order to avoid the concave surface of the isolation structure 202, the liner layer 206 have dopants, such that etching rates of the liner layers 204 and 206 are different in subsequent etching process for forming the isolation structures 202. Therefore, the liner layer 206 may also be referred to as doped oxide layer or doped liner oxide layers. In some embodiments, the dopants doped in the liner layer 206 may include nitrogen, germanium, boron, or carbon. In some embodiments, the dopants doped in the liner layer 206 may be nitrogen. In some embodiments, the liner layer 206 is doped with nitrogen having a doping concentration in a range from about 0.8 mass fraction (wt %) to 1.7 wt %. On the other hand, the liner layer 204 may be pure silicon oxide layer without any dopants. In other embodiments, the liner layer 204 may also have dopants and also be referred to as doped oxide layer or doped liner oxide layers. In some embodiments, the dopants in the liner layers 204 and 206 are different. In other embodiments, the liner layers 204 and 206 have the same dopants in different concentrations.

Figure 1E:
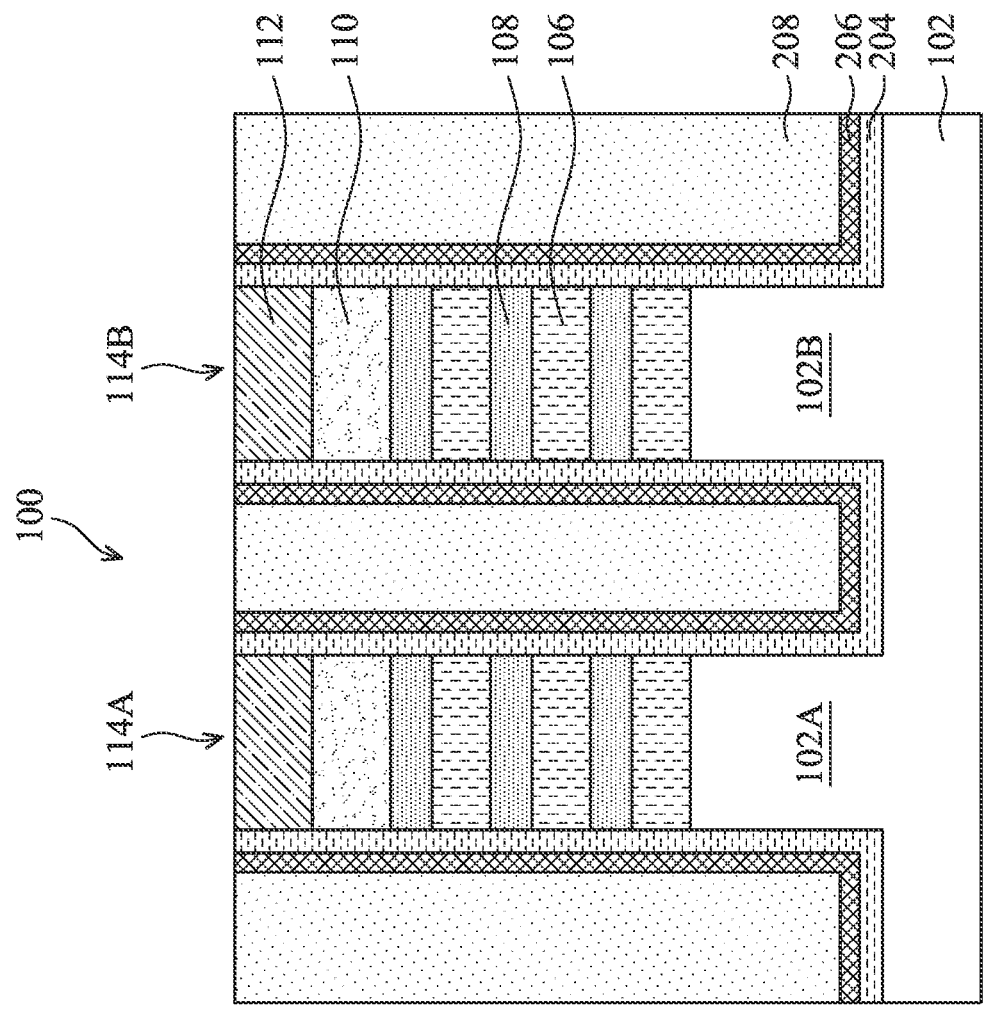

Referring to FIG. 1E, a dielectric material 208 for the isolation structures 202 is deposited over the workpiece 100. Specifically, the dielectric material 208 is formed over the liner layer 206 and fills trenches between the liner layer 206. In some embodiments, the dielectric material 208 may include silicon oxide, silicon nitride, silicon oxynitride, fluorine-doped silicate glass (FSG), a low-k dielectric, combinations thereof, and/or other suitable materials. In various embodiments, the dielectric material 208 may be deposited by a flowable CVD (FCVD) process. After the FCVD process for depositing the dielectric material 208, the dielectric material 208 is annealed to be cured. The deposited dielectric material 208, the liner layer 204, and the liner layer 206 is then thinned and planarized, for example by a chemical mechanical polishing (CMP) process, until top surfaces of the hard mask layer 112 is exposed, as shown in FIG. 1E. After the CMP process, the dielectric material 208 may further be annealed.

Figure 1F:
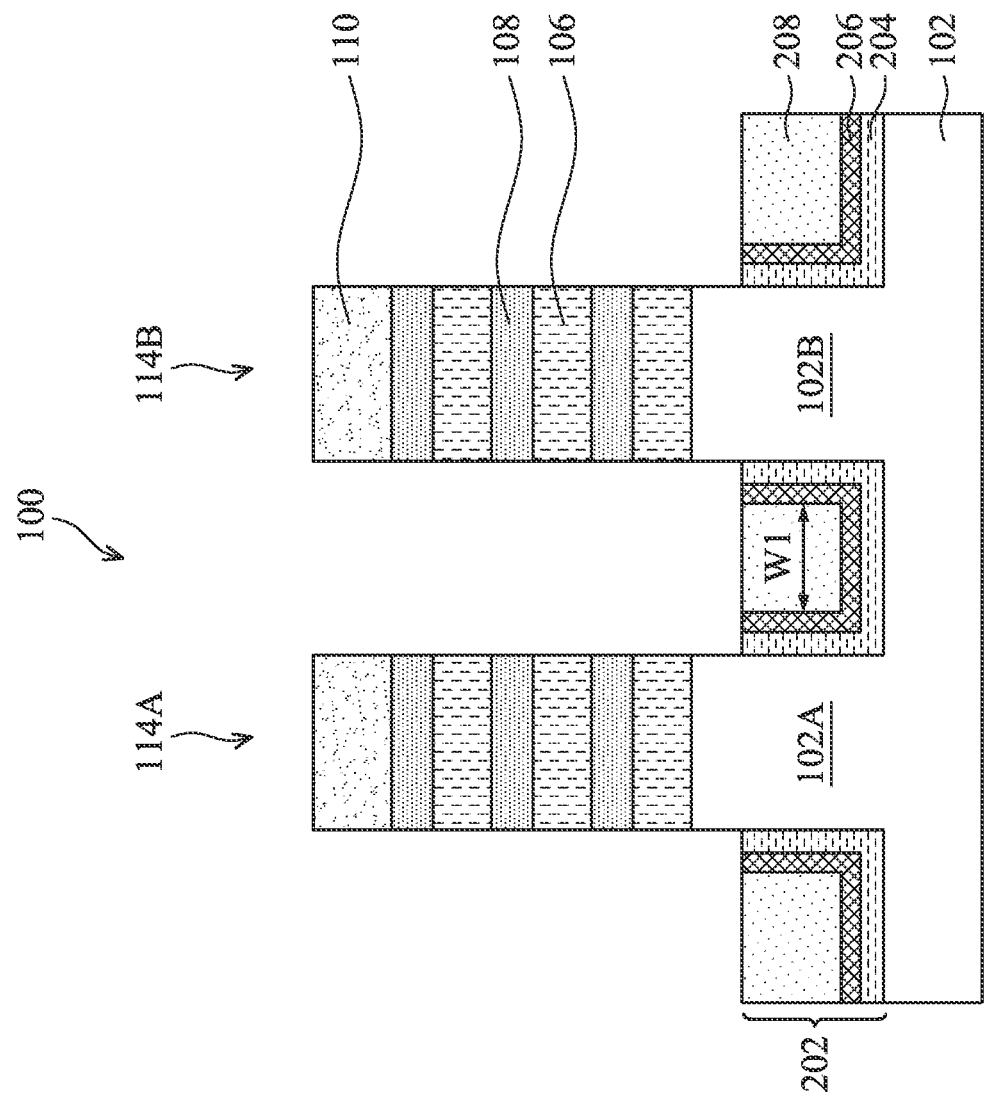

Referring then to FIG. 1F, the hard mask layer 112 is removed and the planarized dielectric material 208, the liner layer 204, and the liner layer 206 are further recessed by a dry etching process, a wet etching process, and/or a combination thereof to form the isolation structures 202 adjacent to the fin structures (102A and 102B). As shown in FIG. 1F, the stack portions of the fins 114 rise above the isolation structures 202 while the fin structures (102A and 102B) are surrounded by the isolation structures 202. In other words, top surface of the substrate 102 is higher than top surfaces of the isolation structures 202. In some aspects, the isolation structures 202 are extending in the X-direction and arranged with the fins 114 in the Y-direction. In some other aspects, the isolation structures 104 are formed around the fins 114. The isolation structures 202 may also be referred to as shallow trench isolation (STI) features. As shown in FIG. 1F, an width W1 of the recessed dielectric material 208 is in a range from about 10 nm to about 15 nm. In some embodiments, the liner layer 206 is on sidewalls and a bottom surface of the dielectric material 208 after the recessing process. In some embodiments, the liner layer 204 is on sidewalls and a bottom surface of the liner layer 206 after the recessing process.

As discussed above, the etching rates of the liner layers 204 and 206 are different. More specifically, the etching rate of the liner layer 204 is greater than the etching rate of the liner layer 206 during the etching of dielectric material 208, the liner layer 204, and the liner layer 206. In some embodiments, the etching rate of the liner layer 204 is in a range from about 20 nm/s to about 25 nm/s. The etching rate of the liner layer 206 is in a range from about 10 nm/s to about 15 nm/s. Therefore, the undesired concave surface of the isolation structure 202 may be avoided. The top surfaces of the liner layers 204 and 206 and the dielectric material 208 are planar, as shown in FIG. 1F. In some embodiments, the top surfaces of the liner layer 206 are higher than the top surfaces of the liner layer 204 and the dielectric material 208.

Figure 1G:
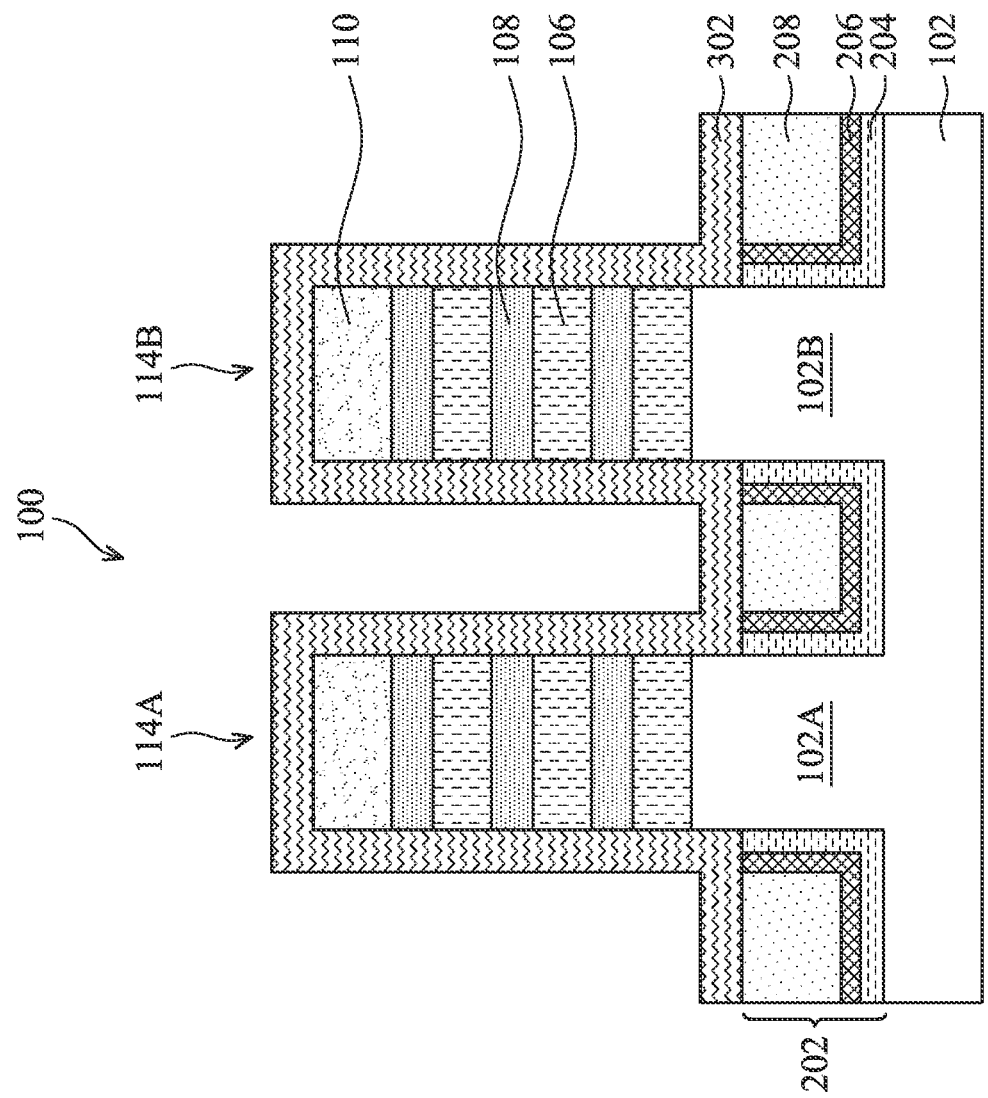

Referring to FIG. 1G, a cladding layer 302 is formed on sidewalls of the fins 114 and sidewalls of the hard mask layer 110, and formed over the isolation structures 202 and the hard mask layer 110. In some embodiments, the cladding layer 302 may have a similar composition to that of the semiconductor layers 106. In some embodiments, the cladding layer 302 may be formed of silicon germanium (SiGe), just like the semiconductor layers 106. This common composition allows selective removal of the semiconductor layers 106 and the cladding layer 302 in a subsequent process (e.g., release process). In some embodiments, the formation of the cladding layer 302 may include conformally grow cladding material, as shown in FIG. 1G. In some embodiments, the cladding layer 302 may be deposited using CVD, ALD, or other suitable deposition method. In some embodiments, the thickness of the cladding layer 302 is the same as the sum of the thicknesses of the liner layer 204 and 206. In other embodiments, the thickness of the cladding layer 302 is greater than the sum of the thicknesses of the liner layers 204 and 206.

Figure 1H:
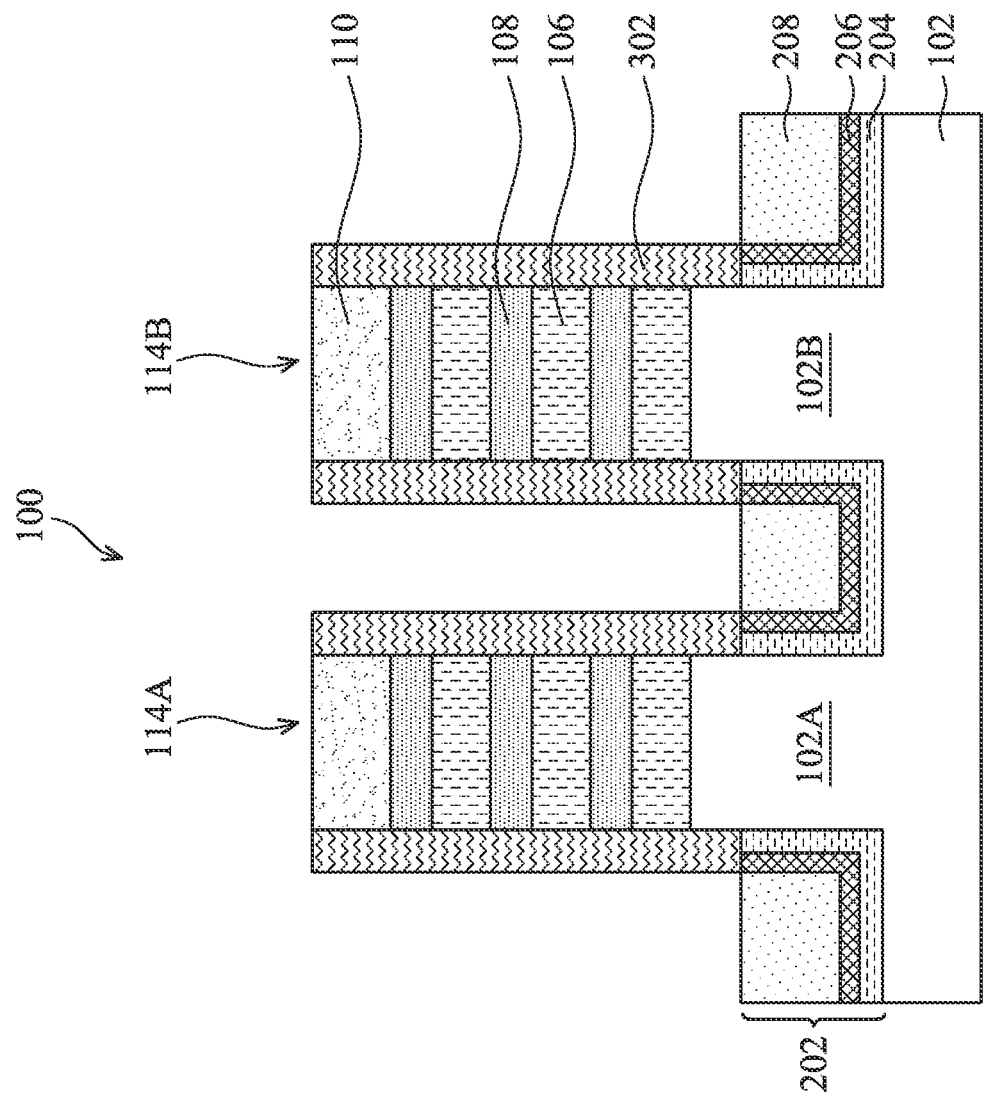

Referring to FIG. 1H, an etch process is performed to remove portions of the cladding layer 302 on top surfaces of the hard mask layer 110 over the fins 114A and 114B, and remove portions of the cladding layer 302 on the top surfaces of the isolation structures 202, so that the cladding layer 302 remains on the sidewalls of the fins 114A and 114B, and the sidewalls of the hard mask layer 110. The etch process may be a isotropic etch process, such as a dry etch process that includes use of plasma of hydrogen bromide (HBr), oxygen ($O_2$), chlorine ($Cl_2$), or mixtures thereof. As shown in FIG. 1H, the top surfaces of the hard mask layer 110 over the fins 114A and 114B and the top surfaces of the isolation structures 202 are exposed after the etch process. In some embodiments that the thickness of the cladding layer 302 is the same as the sum of the thicknesses of the liner layer 204 and 206, sidewalls of the cladding layer 302 are aligned with sidewalls of the dielectric material 208.

Figure 1I:
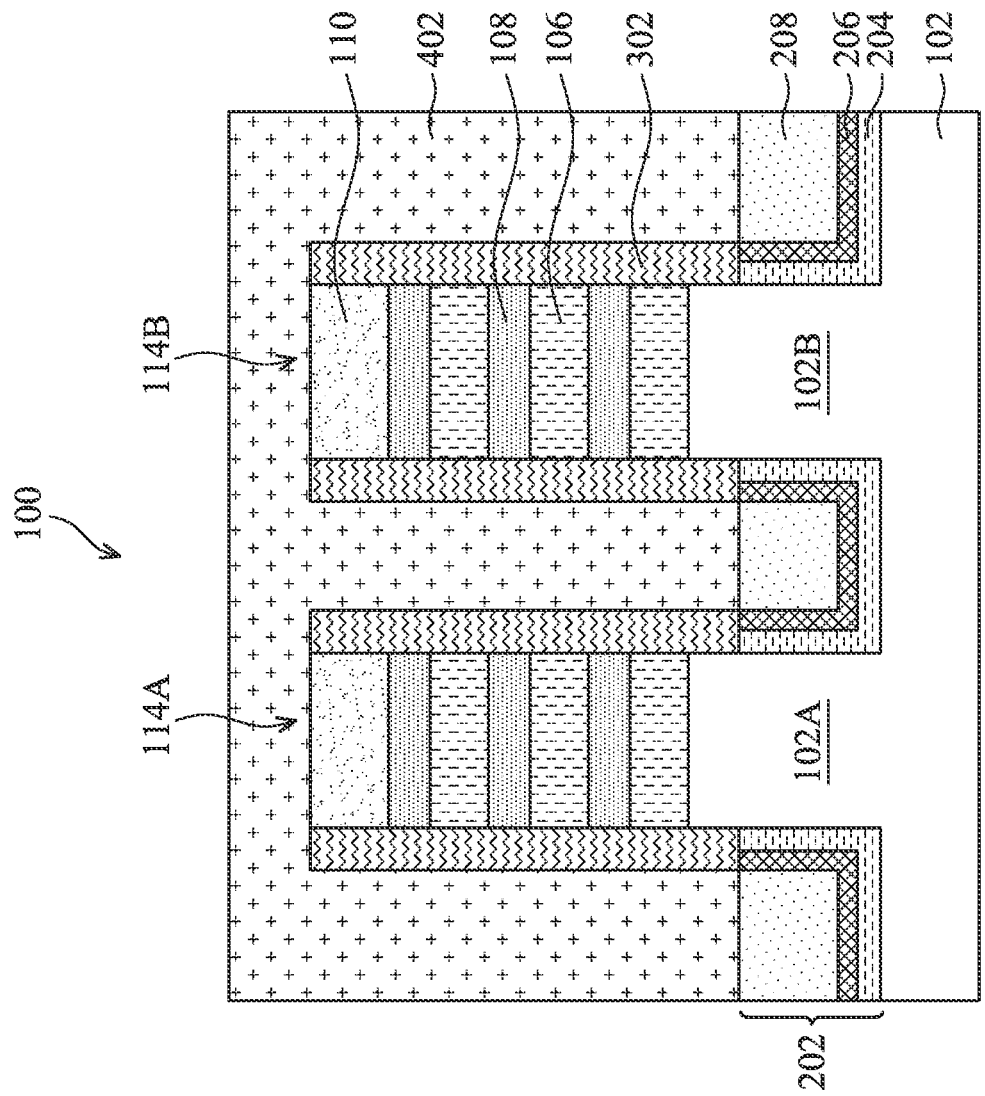

Referring to FIG. 1I, after the etch process, an isolation material 402 is formed over the workpiece 100. Specifically, the isolation material 402 is formed to fill the trenches between the fins 114, and formed over the fins 114, the cladding layer 302, and the isolation structures 202. In some embodiments, the composition of the isolation material 402 may be similar to the composition of the dielectric material 208 of the isolation structures 202. In some embodiments, the isolation material 402 includes a low-k dielectric material such as a dielectric material including Si, O, N, and C (for example, silicon oxide ($SiO_2$), silicon nitride, silicon oxynitride, silicon oxy carbide, silicon oxy carbon nitride). In some embodiments, the isolation material 402 includes tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), other low-k dielectric materials, or combinations thereof. In these embodiments, the isolation material 402 may be deposited using CVD, subatmospheric CVD (SACVD), FCVD, ALD, physical vapor deposition (PVD), spin-on coating, and/or other suitable process.

Figure 1J:
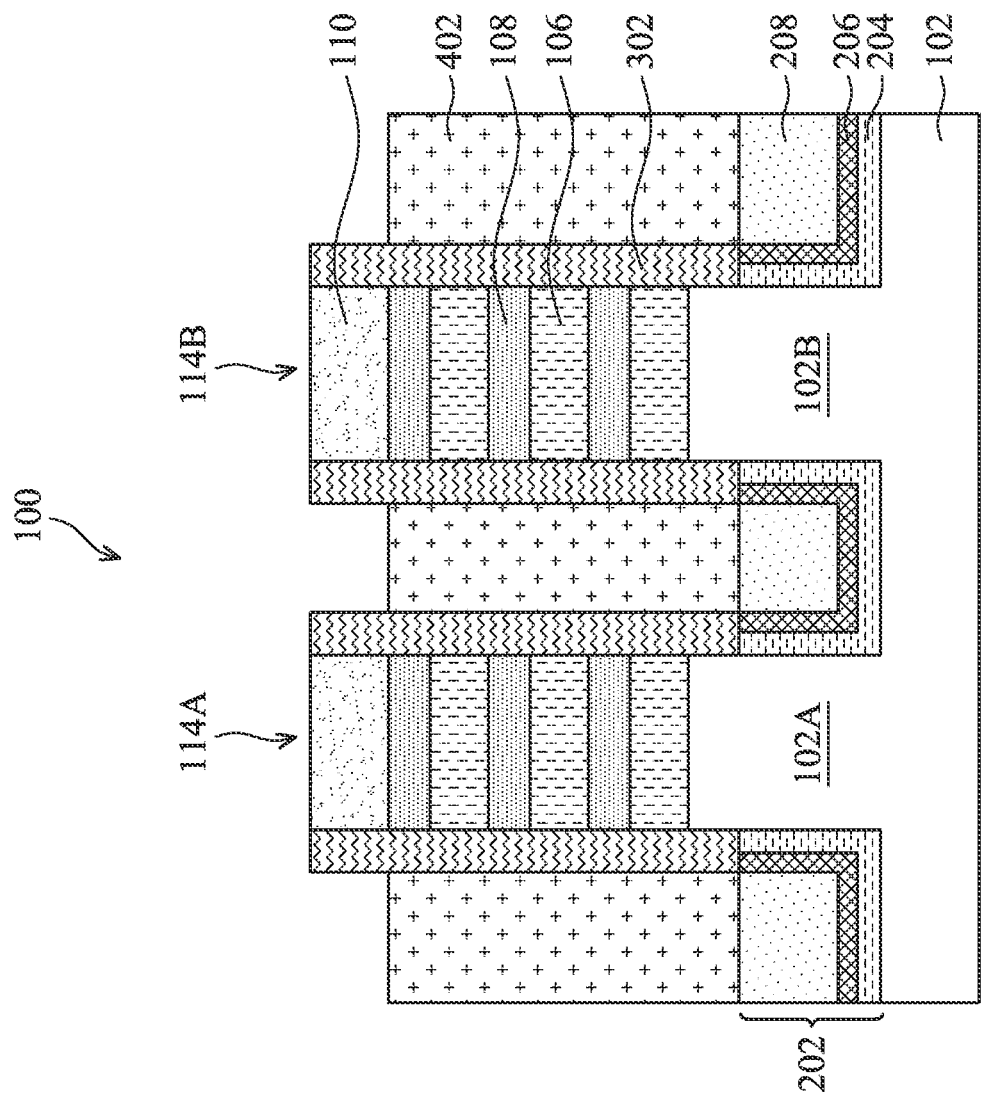

Referring to FIG. 1J, the isolation material 402 is planarized (e.g., by a chemical-mechanical planarization (CMP) process) and recessed (e.g., by an etching process, a wet etching process, and/or a combination thereof). The isolation material 402 is recessed to have top surfaces below the top surfaces of the hard mask layer 110. In some other embodiments, the top surfaces of the isolation material 402 and topmost surfaces of the semiconductor layers 108 are substantially coplanar. The isolation material 402 is between or around neighboring fins 114. Specifically, the stack portions of the fins 114 are surrounded by the isolation material 402. In some aspects, the isolation material 402 also extends in the X-direction and arranged with the fins 114 in the Y-direction.

Figure 1K:
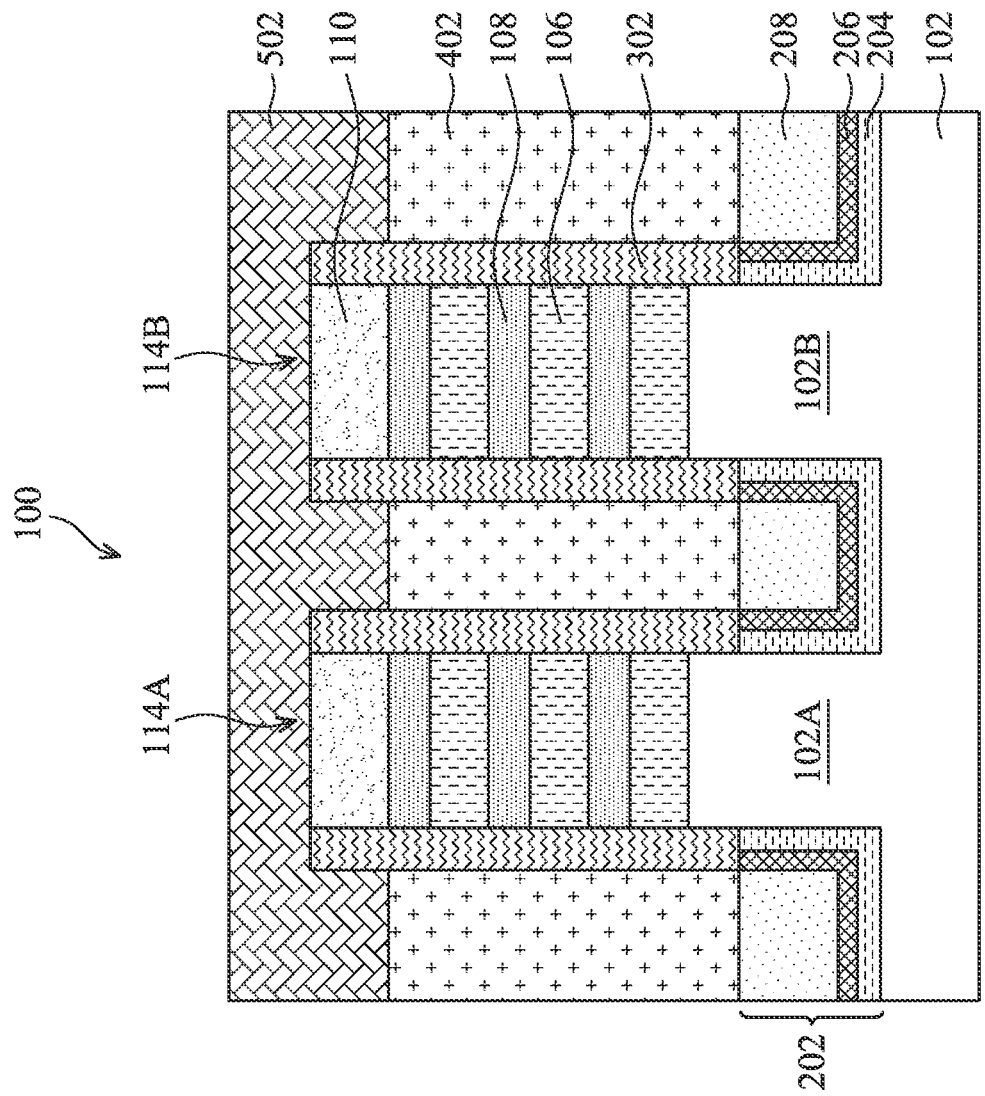

Referring to FIG. 1K, an isolation material 502 is formed over the workpiece 100. Specifically, the isolation material 502 is formed between and over the hard mask layer 110 and the cladding layer 302, and over the isolation material 402. The isolation material 502 may include high-K dielectrics, such as $HfO_2$, $HfSiO_x$ (such as $HfSiO_4$), HfSiON, HfLaO, HfTaO, HfTiO, HfZrO, $HfAlO_x$, $ZrO_2$, $ZrSiO_2$, AlSiO, $Al_2O_3$, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. In some embodiments, the isolation material 502 may be deposited using ALD, CVD, PVD, oxidation-based deposition process, other suitable process, or combinations thereof.

Figure 1L:
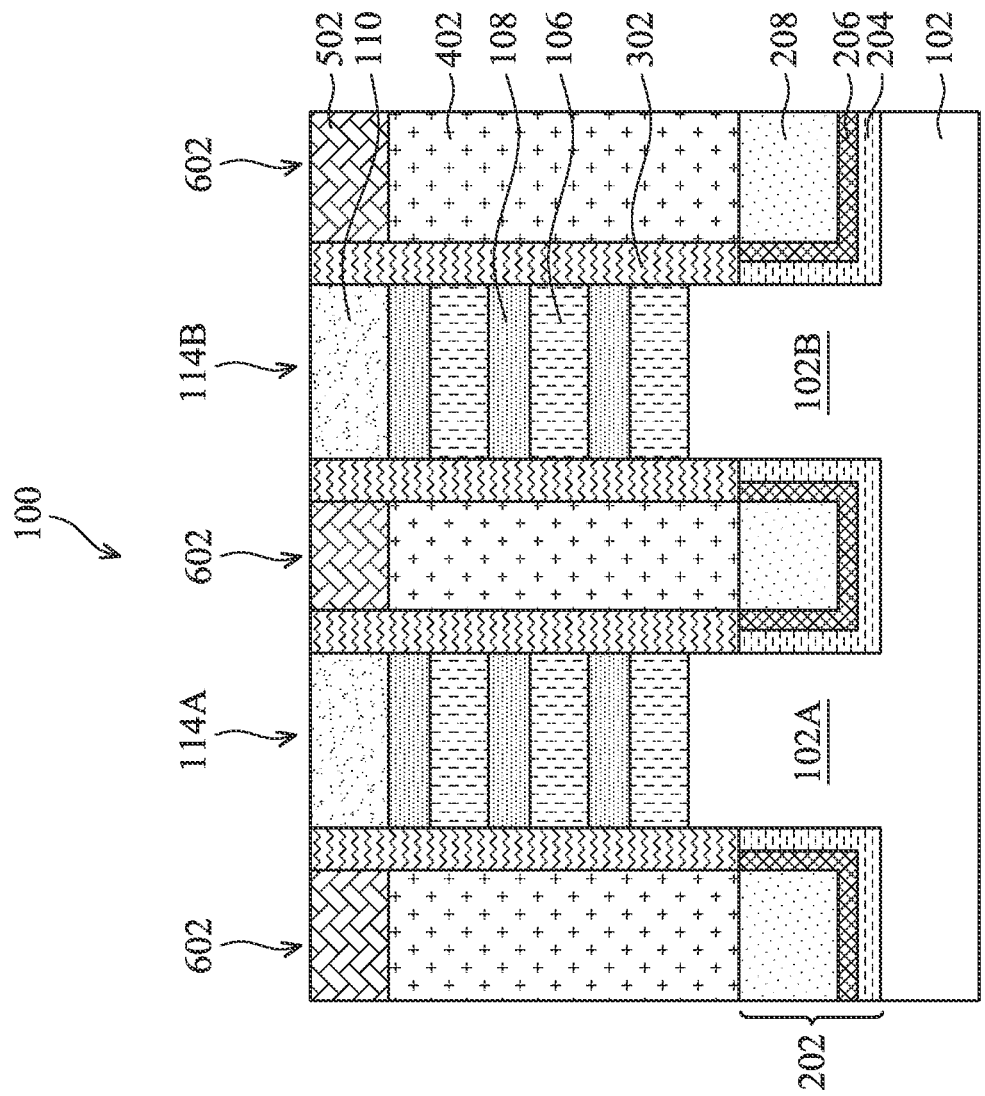

Referring to FIG. 1L, a CMP process is performed to remove excess isolation material 502 over the hard mask layer 110. The top surfaces of the hard mask layer 110 and top surfaces of the cladding layer 302 are exposed after the CMP process. Further, in some embodiments, the top surfaces of the hard mask layer 110, the cladding layer 302, and the isolation material 502 are substantially coplanar after the CMP process. Similarly, in some aspects, the isolation material 502 extend in the X-direction and arranged with the fins 114 in the Y-direction.

As shown in FIG. 1L, After the CMP process, the remaining isolation material 402 and the remaining second isolation material 502 between the fins 114 form the isolation features 602. The isolation features 602 are over the isolation structures 202. The isolation features 602 are in contact with sidewalls of the cladding layer 302. The isolation features 602 are in contact with the top surfaces of the isolation structures 202. The isolation features 602 separate the resultant GAA devices from other devices (not shown). In some embodiments, bottom surfaces of the isolation features 602 are lower than the bottommost semiconductor layers 108 (or bottommost surfaces of the semiconductor layers 108). In some embodiments, the bottom surfaces of the isolation features 602 are lower than topmost surfaces of the substrate 102 (i.e., top surfaces of the fin structures 102A and 102B). In some embodiments that the thickness of the cladding layer 302 is the same as the sum of the thicknesses of the liner layer 204 and 206, sidewalls of the isolation features 602 are aligned with the sidewalls of the dielectric material 208, as shown in FIG. 1L.

Figure 1M:
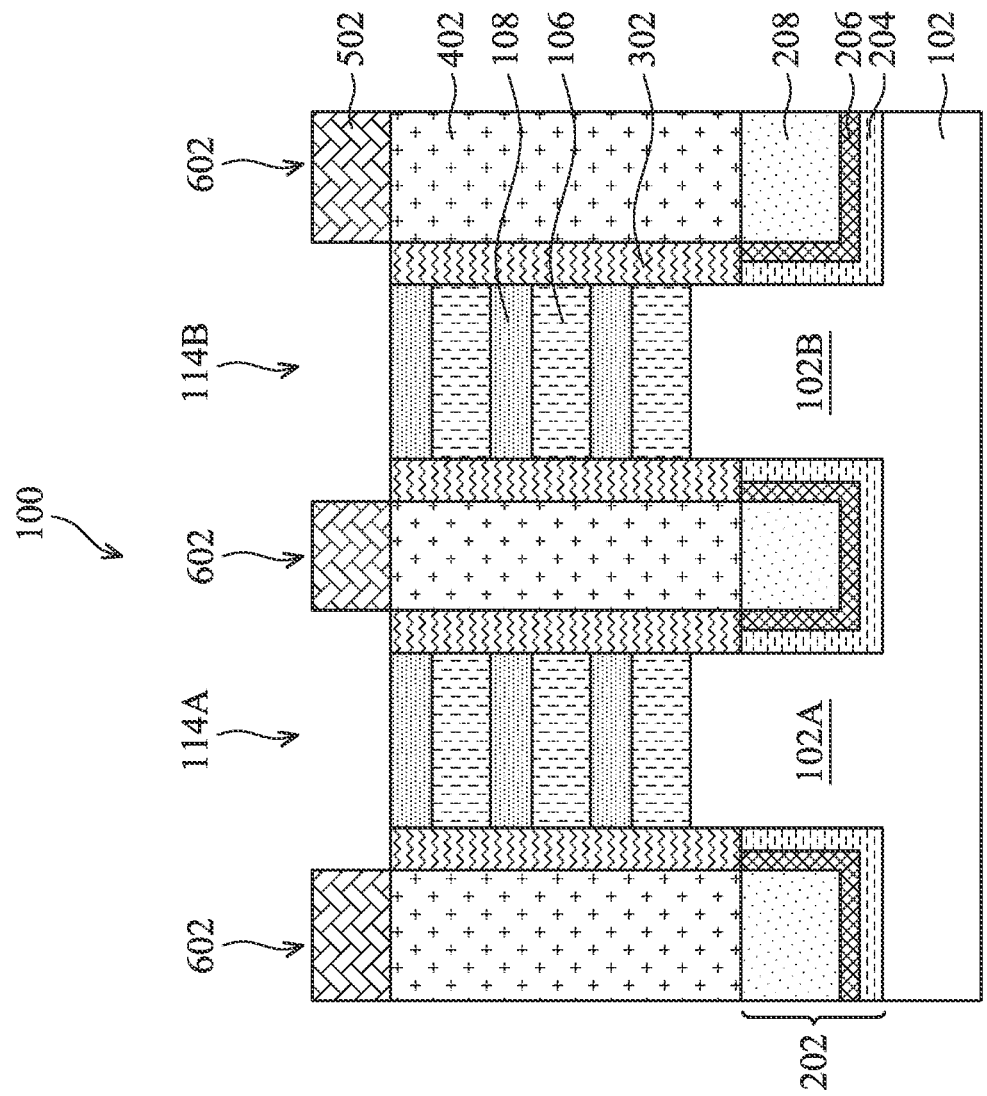

Referring to FIG. 1M, after the CMP process, the workpiece 100 is anisotropically etched to selectively remove a portion of the cladding layer 302 and the hard mask layer 110 to expose the topmost semiconductor layer 108 (or the topmost surface of the semiconductor layers 108), without substantially damaging the isolation material 502 of the isolation features 602. The anisotropic etch process may be a single stage etch process or a multi-stage etch process. In some implementations, the anisotropic etch process may include hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figures 1, 1N:
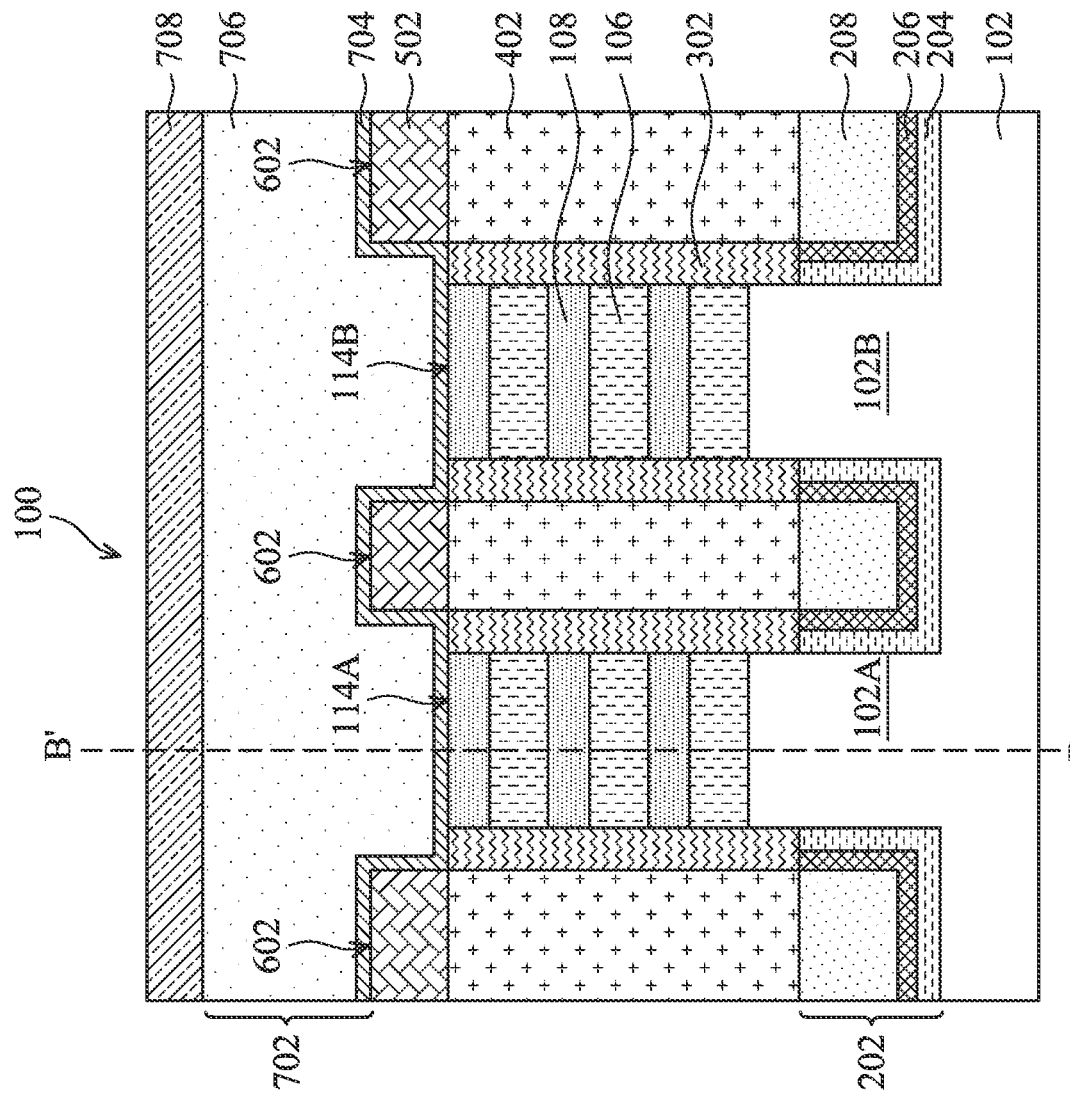

Referring to FIG. 1N-1, a dummy gate structure 702 may be formed over the fins 114, the isolation features 602, and the cladding layer 302. In some embodiments, to form the dummy gate structure 702, a dummy interfacial material of a dummy interfacial layer 704 is first formed over the fins 114, the isolation features 602, and the cladding layer 302. In some embodiments, the dummy interfacial layer 704 may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material of a dummy gate electrode 706 is formed over the dummy interfacial material. The dummy gate material may include a conductive material selected from a group comprising of polysilicon, W, Al, Cu, AlCu, Ti, TiAlN, TaC, TaCN, TaSIN, Mn, Zr, TiN, Ta, TaN, Co, Ni, and/or combinations thereof. The dummy gate material and/or the dummy interfacial material may be formed by way of a thermal oxidation process and/or a deposition process (e.g., PVD, CVD, PECVD, and ALD). In some embodiments, a mask structure 708 is formed over the dummy gate material. In some embodiments, the mask structure 708 may be formed using photolithography and removal (e.g., etching) processes. In some embodiments, the mask structure 708 may include photoresist materials or hard mask materials. After the formation of the mask structure 708, a removal process (e.g., etching) may be performed to remove portions of the dummy gate material and the dummy interfacial material that do not directly underlie the mask structure 708 (not shown), thereby forming the dummy gate structure 702 with the dummy gate electrode 706 and the dummy interfacial layer 704. The dummy gate structures 702 may undergo a gate replacement process through subsequent processing to form metal gates, such as a high-k metal gate, as discussed in greater detail below.

Figures 1, 1N, 2:
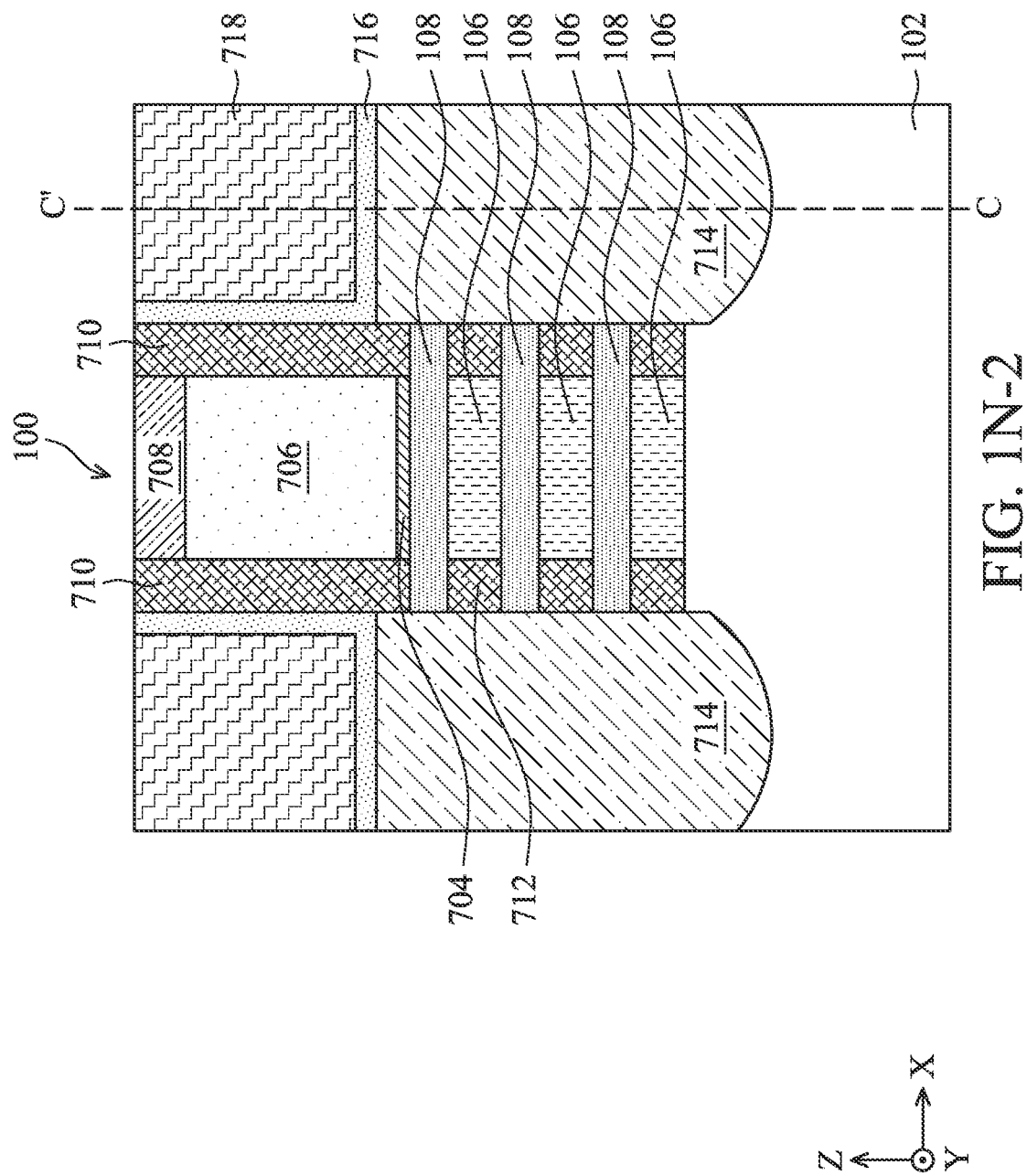
Figures 1, 1N, 2, 3:
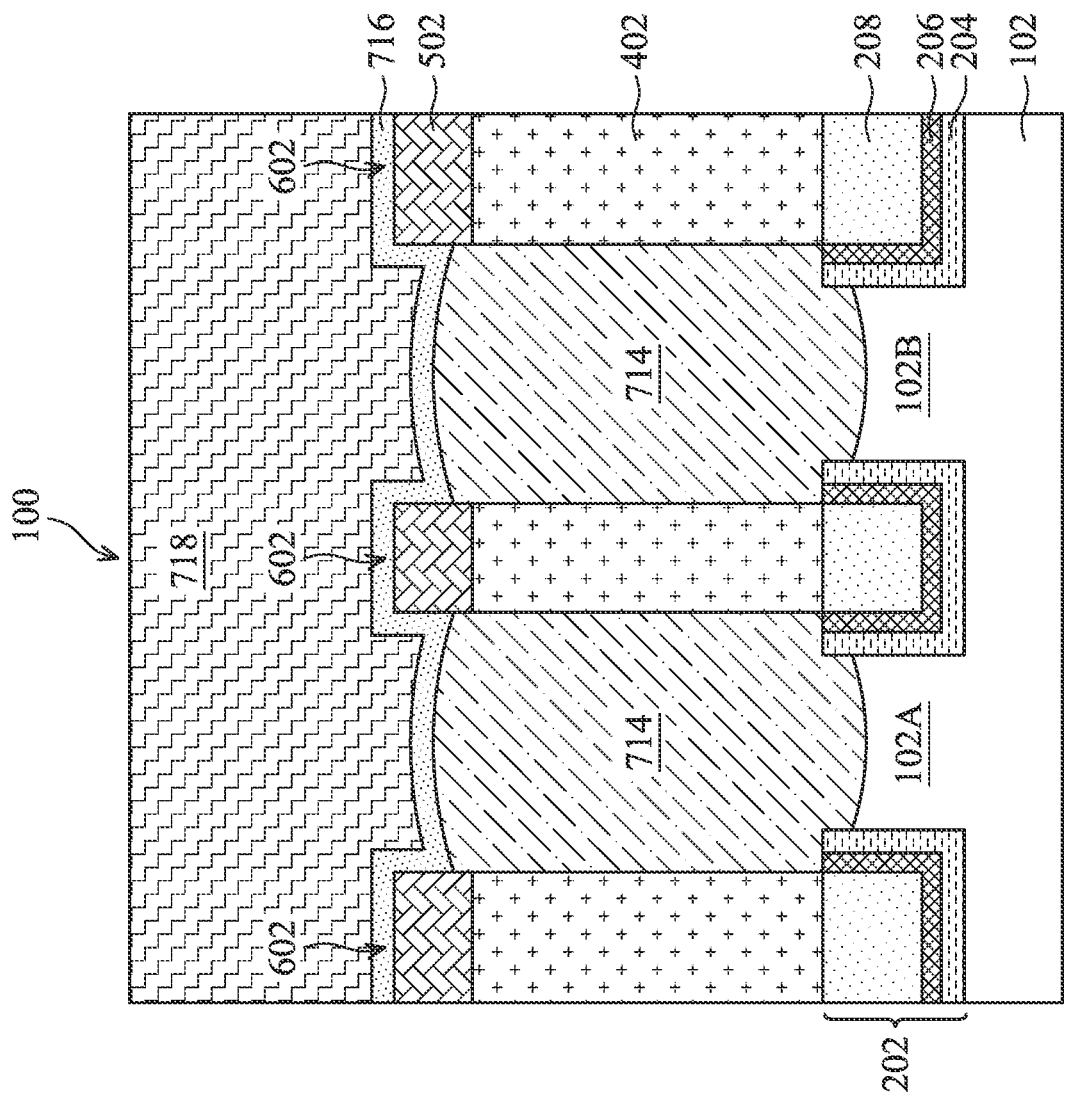
Figure 10:
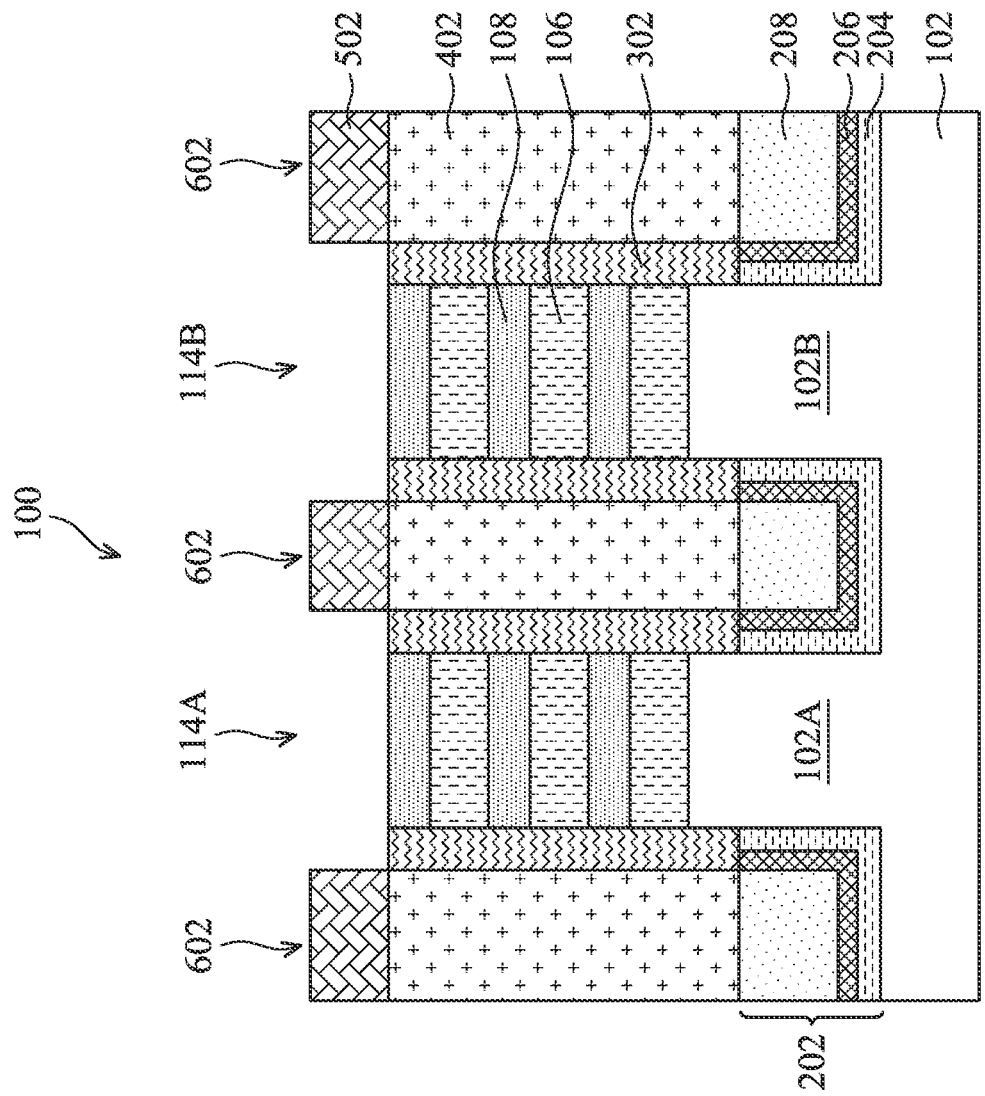

After forming the dummy gate structure 702, subsequent processes are performed to form various features, such as gate spacers, inner spacers, source/drain features, a contact etch stop layer (CESL), and an interlayer dielectric (ILD) layer. FIGS. 1N-2 and 1N-3 are cross-sectional views of the workpiece 100 after forming the dummy gate structure 702 followed by the subsequent processes, in which FIG. 1N-2 is a cross-sectional view along line B-B' of FIG. 1N-1, and FIG. 1N-3 is a cross-sectional view along line C-C' of FIG. 1N-1.

As shown in FIG. 1N-2, gate spacers 710 are formed on sidewalls of the dummy interfacial layer 704, the dummy gate electrode 706, and the mask structure 708, and over the topmost semiconductor layer 108 (or the topmost surface of the semiconductor layers 108). The gate spacers 710 may include silicon nitride ($Si_3N_4$), silicon oxide ($SiO_2$), silicon carbide (SIC), silicon oxycarbide (SiOC), silicon oxynitride (SiON), silicon oxycarbon nitride (SiOCN), carbon doped oxide, nitrogen doped oxide, porous oxide, or combinations thereof. The gate spacers 710 may include a single layer or a multi-layer structure. In some embodiments, the gate spacers 710 may be formed by depositing a spacer layer (containing the dielectric material) over the fins 114, the isolation features 602, and the dummy gate structure 702, followed by an anisotropic etching process to remove top portions of the spacer layer from the top surfaces of the isolation features 602, the fins 114, and the dummy gate structure 702. After the etching process, portions of the spacer layer on sidewall surfaces of the dummy gate structure substantially remain and become the gate spacers 710. In some embodiments, the anisotropic etching process is a dry (e.g., plasma) etching process. Additionally or alternatively, the formation of the gate spacers 710 may also involve chemical oxidation, thermal oxidation, ALD, CVD, and/or other suitable methods. The gate spacers 710 may also be interchangeably referred to as the top spacers.

Still referring to FIGS. 1N-2 and 1N-3, inner spacers 712 are formed between the semiconductor layers 108. In some embodiments, sidewalls of the inner spacers 712 are aligned to sidewalls of the gate spacers 710 and the semiconductor layers 108, as shown in FIG. 1N-2. In order to form the inner spacers 712, portions of the fins 114 and the cladding layer 302 uncovered by the dummy gate structure 702 and the gate spacers 710 are recessed to form source/drain trenches (not shown) in the fins 109 to expose sidewalls of the semiconductor layers 106. Side portions of the semiconductor layers 106 under the gate spacers 710 are then removed via a selective etching process to form gaps (not shown). Specifically, the selective etching process is performed that selectively etches the side portions of the semiconductor layers 106 and the cladding layer 302 below the gate spacers 710, with minimal (or no) etching of semiconductor layers 108, so that the gaps are formed between the semiconductor layers 108 as well as between the semiconductor layers 108 and the substrate 102, below the gate spacers 710. The selective etching process is a dry etching process, a wet etching process, other suitable etching process, or combinations thereof.

After the selective etching process, a deposition process forms a spacer layer into the source/drain trenches and the gaps, such as CVD, PVD, ALD, HDPCVD, MOCVD, RPCVD, PECVD, LPCVD, ALCVD, APCVD, other suitable methods, or combinations thereof. The deposition process is configured to ensure that the spacer layer fills the gaps between the semiconductor layers 108 as well as between the semiconductor layer 108 and the substrate 102 under the gate spacers 710.

An etching process is then performed that selectively etches the spacer layer to form inner spacers 712 (as shown in FIG. 1N-2) with minimal (to no) etching of the semiconductor layer 108, the substrate 102, the dummy gate structure 702, and the gate spacers 710. The spacer layer (and thus inner spacers 712) includes a material that is different than a material of the semiconductor layers 108 and a material of the gate spacers 710 to achieve desired etching selectivity during the etching process. In some embodiments, the inner spacers 712 include a dielectric material that includes silicon, oxygen, carbon, nitrogen, other suitable material, or combinations thereof (for example, silicon oxide ($SiO_2$), silicon oxynitride (SiON), silicon oxycarbide (SiOC), silicon oxycarbon nitride (SiOCN)). In some embodiments, the inner spacer layer includes a low-k dielectric material, such as those described herein.

Still referring to FIGS. 1N-2 and 1N-3, source/drain features 714 are formed in the fins 114. More specifically, the source/drain features 714 are formed in the source/drain trenches of the fins 114 discussed above. The source/drain features 714 are in contact with the sidewalls of the gate spacers 710, the semiconductor layers 108, and the inner spacers 712, as shown in FIG. 1N-2. In some embodiments, the source/drain features 714 are in contact with the sidewalls of the isolation features 602, as shown in FIG. 1N-3. In some embodiments, the source/drain features 714 may have top surfaces that extend higher than the top surface of the topmost semiconductor layer 108 (e.g., in the Z-direction). In some embodiments, the source/drain features 714 may have the top surfaces higher than the top surfaces of the isolation material 402 of the isolation features 602, as shown in FIG. 1N-3. The semiconductor layers 108 that extend from one source/drain feature 714 to the other source/drain feature 714 may form channels of the GAA device, so that the semiconductor layers 108 may also be referred to as channel layers. In other embodiments, the source/drain features 714 are in contact with the top surface of the isolation structures 202. More specifically, the source/drain features 714 are in contact with the top surfaces of the liner layer 204 and 206, as shown in FIG. 1N-3. In other embodiments, the source/drain features 714 are in contact with the sidewalls of the liner layer 204. In some embodiments that the thickness of the cladding layer 302 is the same as the sum of the thicknesses of the liner layer 204 and 206, sidewalls of the source/drain features 714 are aligned with the sidewalls of the dielectric material 208, as shown in FIG. 1N-3.

One or more epitaxy processes may be employed to grow the source/drain features 714. Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 714 may include any suitable semiconductor materials. For example, the source/drain features 714 in an n-type GAA device may include silicon (Si), silicon carbide (SiC), silicon phosphide (SiP), silicon arsenide (SiAs), silicon phosphoric carbide (SiPC), or combinations thereof; while the source/drain features 714 in a p-type GAA device may include silicon (Si), silicon germanium (SiGe), germanium (Ge), silicon germanium carbide (SiGeC), or combinations thereof. The source/drain features 714 may be doped in-situ or ex-situ. For example, the epitaxially grown Si source/drain features may be doped with carbon to form silicon: carbon (Si: C) source/drain features, phosphorous to form silicon: phosphor (Si: P) source/drain features, or both carbon and phosphorous to form silicon carbon phosphor (SiCP) source/drain features; and the epitaxially grown SiGe source/drain features may be doped with boron. One or more annealing processes may be performed to activate the dopants in the source/drain features 714. The annealing processes may include rapid thermal annealing (RTA) and/or laser annealing processes.

Still referring to FIGS. 1N-2 and 1N-3, a contact etch stop layer (CESL) 716 over the source/drain features 714 and an interlayer dielectric (ILD) layer 718 over the CESL 716 are formed. Specifically, the CESL 716 is conformally formed on the sidewalls of the gate spacers 710, over the top surfaces of the source/drain features 714, on the sidewalls and top surfaces of the isolation material 502 of the isolation features 602, as shown in FIGS. 1N-2 and 1N-3. The ILD layer 718 is formed over and between the CESL 716. The CESL 716 includes a material that is different than ILD layer 718. The CESL 716 may include $La_2O_3$, $Al_2O_3$, SiOCN, SiOC, SiCN, $SiO_2$, SiC, ZnO, ZlN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 718 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 718 may be formed by PECVD (plasma enhanced CVD), FCVD (flowable CVD), or other suitable methods. Subsequent to the deposition of the CESL 716 and the ILD layer 718, a CMP process and/or other planarization process is performed on the CESL 716 and the ILD layer 718 until the top surface of the mask structure 708 is exposed.

Referring to FIG. 1O, the dummy gate structure 702 and the mask structure 708 are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 702 and the mask structure 708. Then, the dummy gate structures 702 and the mask structure 708 are selectively etched through the masking element. The gate spacers 710 (not shown in FIG. 1O) may be used as the masking element or a part thereof. Etch selectivity may be achieved by selecting the appropriate etching chemicals, and the dummy gate structures 702 may be removed without substantially affecting the CESL 716 and the ILD layer 718 shown in FIGS. 1N-2 and 1N-3. After removing, the top surfaces of the topmost semiconductor layers 108 and the cladding layer 302 are exposed, as shown in FIG. 1O.

Figure 1P:
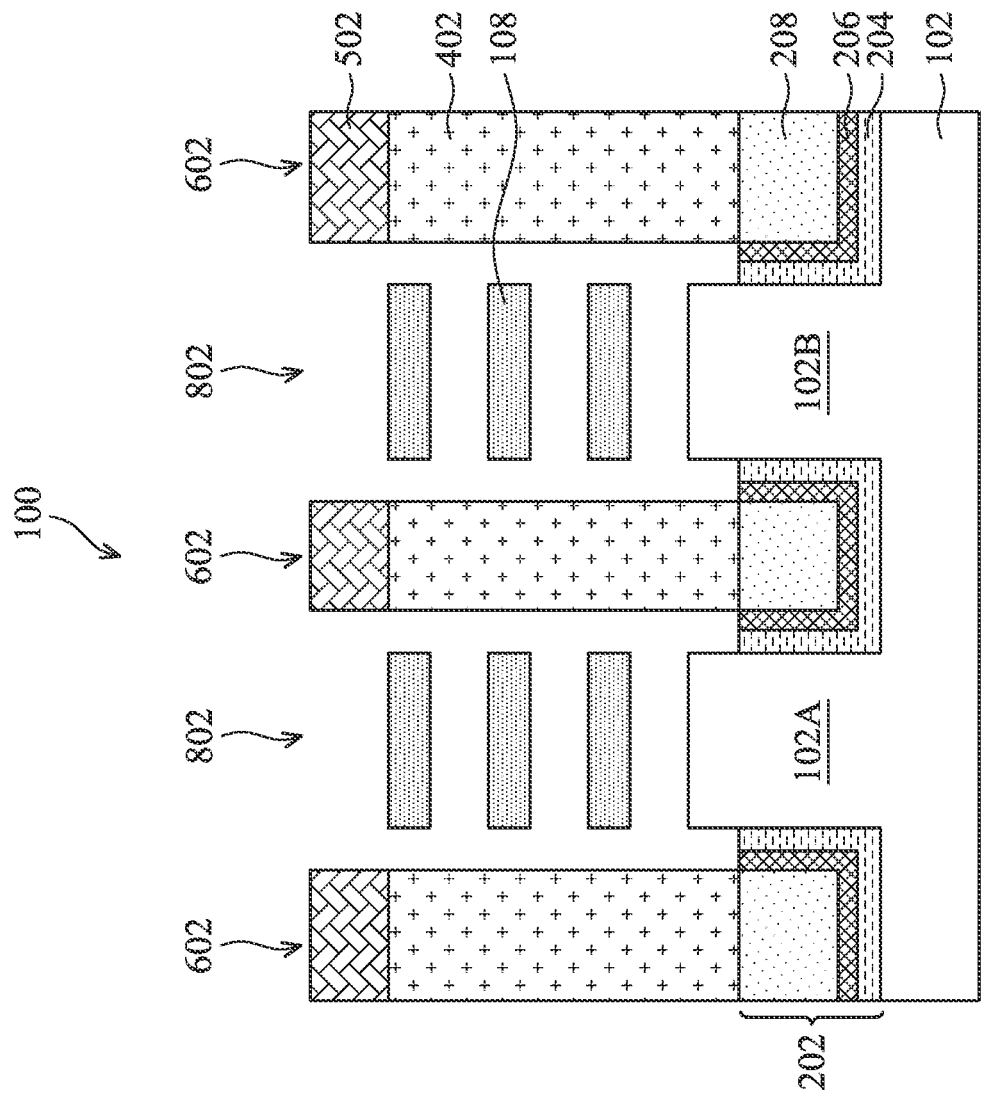

Referring to FIG. 1P, the semiconductor layers 106 of the fins 114 and the cladding layer 302 are selectively removed after removing the dummy gate structure 702 and the mask structure 702 to form gate trenches 802, using a wet or dry etching process for example, so that the semiconductor layers 108 are exposed to form nanostructures. This process may also be referred to as a wire release process, a nanowire release process, a nanosheet release process, a nanowire formation process, a nanosheet formation process, or a wire formation process. In some embodiments, the removal of the semiconductor layers 106 and the cladding layer 302 causes the exposed semiconductor layers 108 to be spaced apart from each other in the vertical direction (e.g., in the Z-direction). It should be noted that the sidewalls of the semiconductor layers 108 is separated from the sidewalls of the isolation features 602. In some embodiments, one or more isolation material 502 of the isolation features 602 may be removed after the removing of the semiconductor layers 106 of the fins 114 and the cladding layer 302, such that gate structures of the resultant adjacent GAA devices may be connected each other.

Figure 1Q:
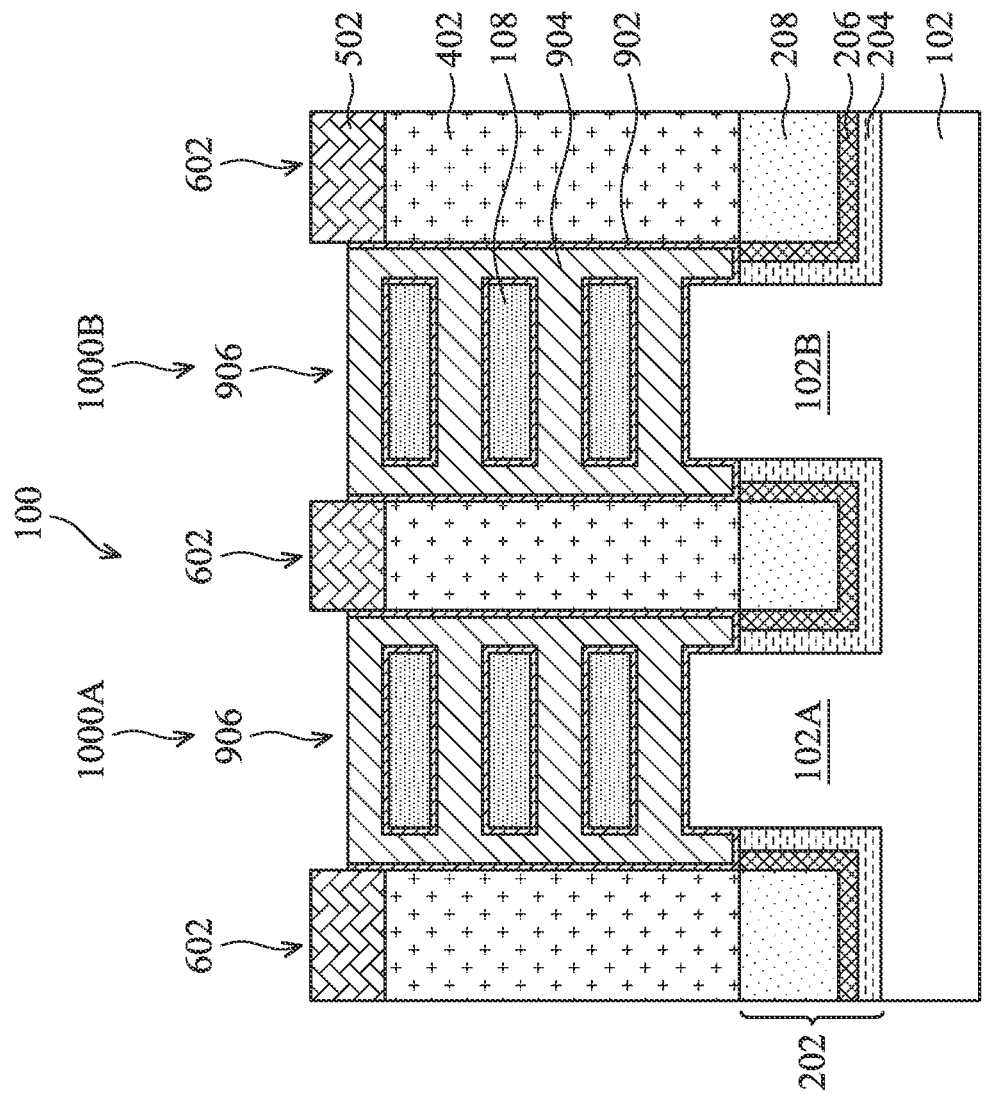

Referring to FIG. 1Q, a gate dielectric layer 902 and a gate electrode 904 over the gate dielectric layer 902 are formed to fill the gate trenches 802 to construct the gate structures 906. In some embodiments, the gate dielectric layer 902 is formed to wrap around the semiconductor layers 108. Additionally, the gate dielectric layer 902 also formed over the top surface of the isolation structures 202, on the top surfaces and sidewalls of the substrate 102 (the fin structures 102A and 102B of the fins 114), and on the sidewalls of the isolation features 602, as shown in FIG. 1Q. The gate dielectric layer 902 may include a dielectric material having a dielectric constant greater than a dielectric constant of $SiO_2$, which is approximately 3.9. For example, the gate dielectric layer 902 may include hafnium oxide ($HfO_2$), which has a dielectric constant in a range from about 18 to about 40. Alternatively, the gate dielectric layer 902 may include other high-K dielectrics, such as $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfLaO$, $HfSiO$, $LaSiO$, $AlSiO$, $HfTaO$, $HfTiO$, $(Ba,Sr)TiO_3$ (BST), $Al_2O_3$, $Si_3N_4$, oxynitrides (SiON), combinations thereof, or other suitable material. The gate dielectric layers 902 may be formed by ALD, PVD, CVD, oxidation, and/or other suitable methods.

In some embodiments, an interfacial layer are formed to wrap around the exposed semiconductor layers 108 before the formation of the gate dielectric layer 902, so that the gate dielectric layer 902 is separated from semiconductor layers 108 by the interfacial layer. In some embodiments, the interfacial layer may include a dielectric material such as silicon oxide ($SiO_2$), HfSiO, or silicon oxynitride (SiON). The interfacial layer may be formed by chemical oxidation, thermal oxidation, ALD, CVD, and/or other suitable method.

Still referring to FIG. 1Q, the gate electrode 904 is formed to fill the remaining spaces of the gate trenches 802 and over the gate dielectric layer 902 in such a way that the gate electrode 904 wraps around the semiconductor layers 108, the gate dielectric layer 902, and the interfacial layers (if present). The gate electrode 904 and the gate dielectric layer 902 may be collectively constructed and/or called as the gate structures 906 wrapping around the semiconductor layers 108. The gate electrode 904 may include a single layer or alternatively a multi-layer structure. In some embodiments, the gate electrode 904 may include a capping layer, a barrier layer, an n-type work function metal layer, a p-type work function metal layer, and a fill material (not shown).

The capping layer may be formed adjacent to the gate dielectric layer 902 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-type work function metal layer may be formed adjacent to the barrier layer. In an embodiment the n-type work function metal layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the n-type work function metal layer may be deposited utilizing ALD, CVD, or the like. However, any suitable materials and processes may be utilized to form the n-type work function metal layer.

The p-type work function metal layer may be formed adjacent to the n-type work function metal layer. In an embodiment, the p-type work function metal layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, Ru, AlCu, Mo, MoSiz, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-type work function metal layer may be deposited using a deposition process such as ALD, CVD, or the like, although any suitable deposition process may be used.

Still referring to FIG. 1Q, after forming the gate dielectric layer 902 and the gate electrode 904, the gate dielectric layer 902 and the gate electrode 904 are recessed to form the gate structures 906 over the fin structures (102A and 102B) and the isolation structures 202, so that its top surface is below the top surfaces of the isolation features 602 (or the top surfaces of the isolation material 502), but above the top surfaces of the isolation material 402 of the isolation features 602. In other words, the top surfaces of the isolation material 502 of the isolation features 602 are higher than the top surfaces of the gate dielectric layer 902 and the gate electrode 904 of the gate structures 906. The recessing of the gate electrode 904 may implement a wet etching or a dry etching process that selectively etches the gate electrode 904. In some embodiments, the etching process also etches the gate dielectric layer 902, so that the gate dielectric layer 902 over the top surfaces and top sidewalls of the isolation features 602 are removed. The gate structures 906 (more specifically, the gate dielectric layer 902) in direct contact with the top surfaces of the liner layer 204 and 206, as shown in FIG. 1Q. In some aspects, the isolation structures 202 are under the gate structures 906. After the recessing process, a semiconductor structure having two GAA devices 1000A and 1000B arranged in the Y-direction are formed.

Figure 1R:
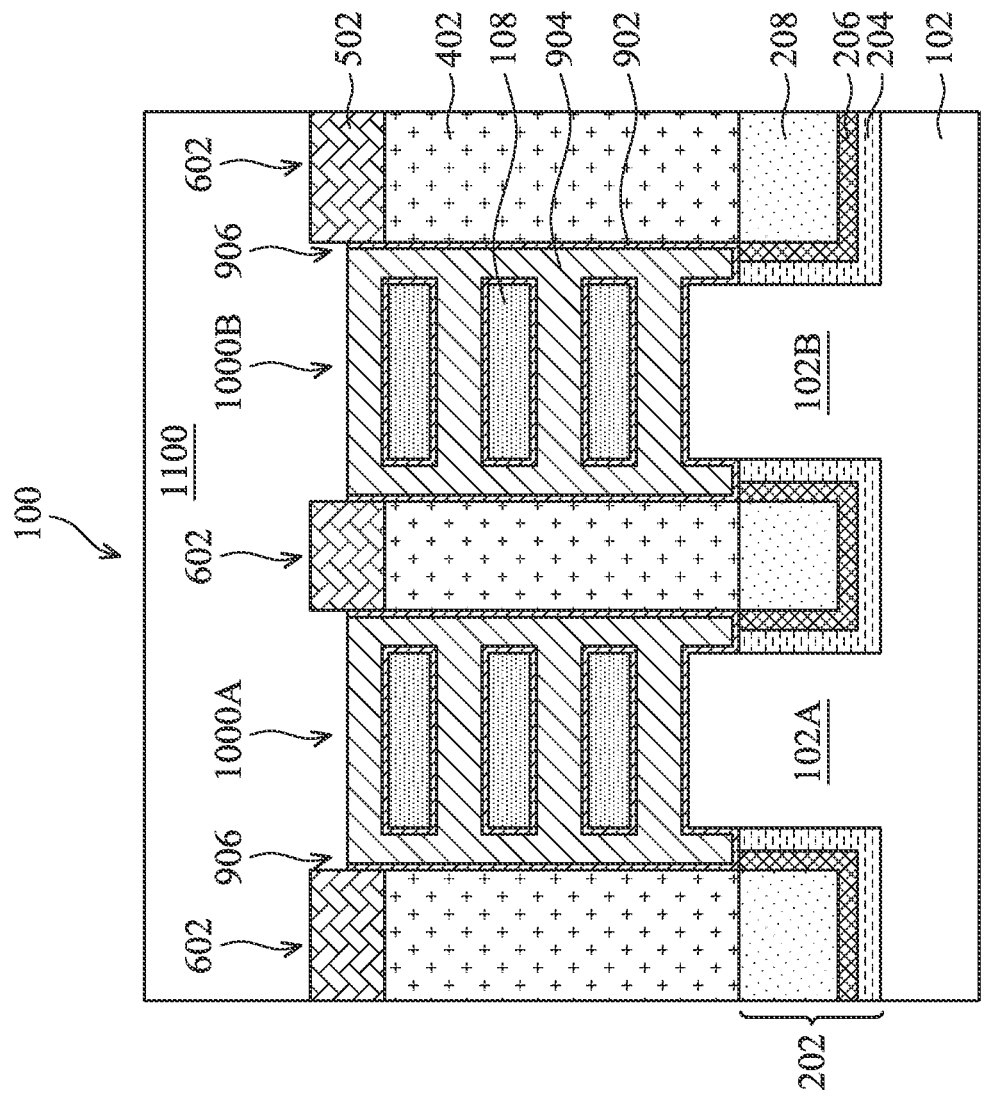

Referring to FIG. 1R, a dielectric layer 1100 is formed over the workpiece 100. The dielectric layer 1100 may be formed by any suitable processes, such as CVD, PECVD, flowable CVD (FCVD), or combinations thereof. The dielectric layer 1100 covers the top surfaces of the isolation features 602 as well as the top surfaces of the gate structure 906. The dielectric layer 1100 may include a dielectric material, such as $SiO_2$, SiOC, SiON, SiOCN, nitride-based dielectric, metal oxide dielectric, $HfO_2$, $Ta_2O_5$, $TiO_2$, $ZrO_2$, $Al_2O_3$, $Y_2O_3$, or combinations thereof.

After the formation of the dielectric layer 1100, gate contacts (not shown) may be formed in the dielectric layer 1802 to contact the gate structures 906 of the GAA devices 1000A and 1000B. The gate contacts may each include a conductive material such as Al, Cu, W, Co, Ti, Ta, Ru, TiN, TiAl, TiAlN, TaN, TaC, NiSi, CoSi, combinations of these, or the like, although any suitable material may be deposited using a deposition process such as sputtering, CVD, electroplating, electroless plating, or the like.

Figure 2A:
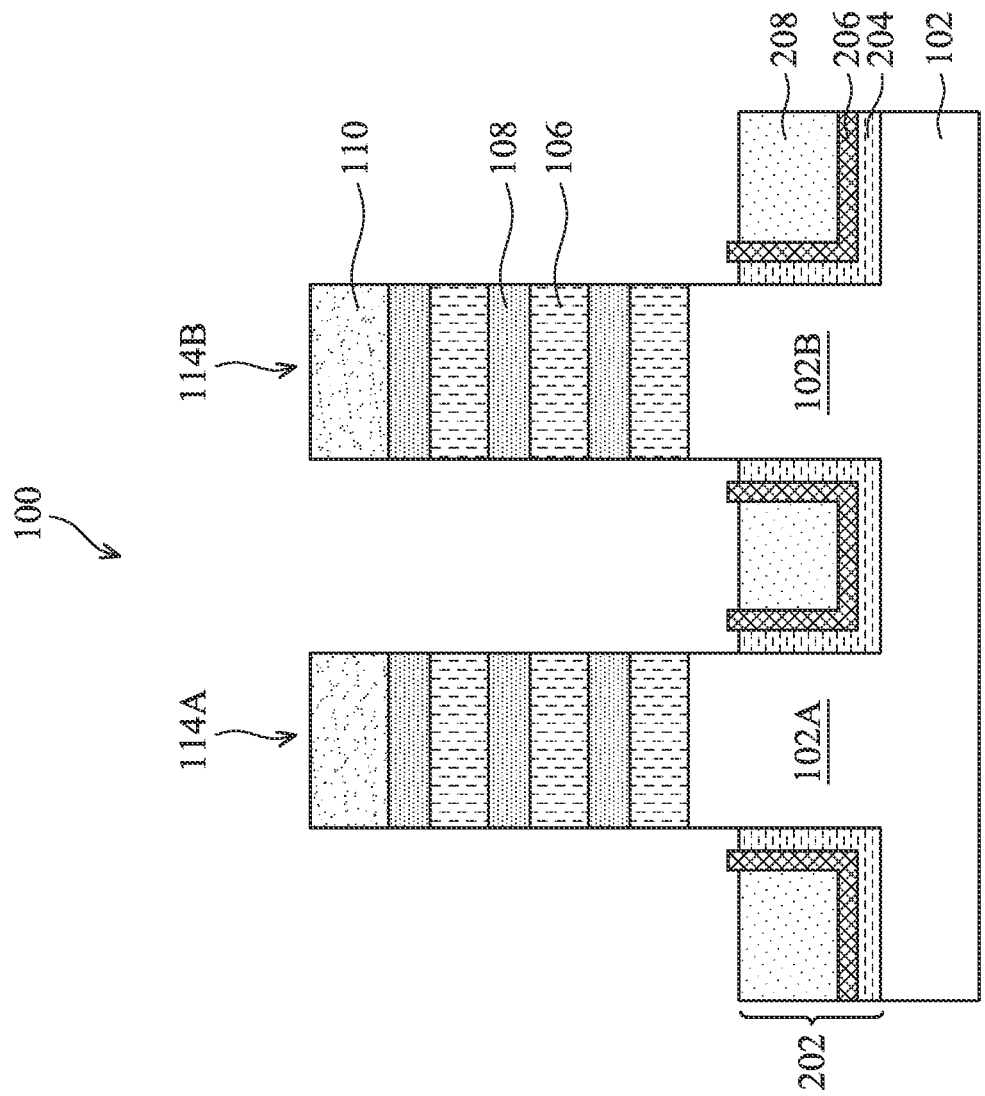
FIGS. 2A and 2B are cross-sectional views of an embodiment of a workpiece of the present disclosure constructed at the same fabrication stages as FIGS. 1F and 1R, respectively, in accordance with some embodiments.

FIG. 2A shows a cross-sectional view at the same fabrication stages as FIG. 1F. As discussed above, the etching rate of the liner layer 204 is greater than the etching rate of the liner layer 206 during the etching of dielectric material 208, the liner layer 204, and the liner layer 206 for forming the isolation structures 202. Therefore, in some embodiments, the top surfaces of the liner layer 206 are higher than the top surfaces of the liner layer 204 and the dielectric material 208. In some aspects, the liner layer 206 has extending portions that are higher than the liner layer 204 and the dielectric material 208. Sidewalls of the extending portions are exposed.

Figure 2B:
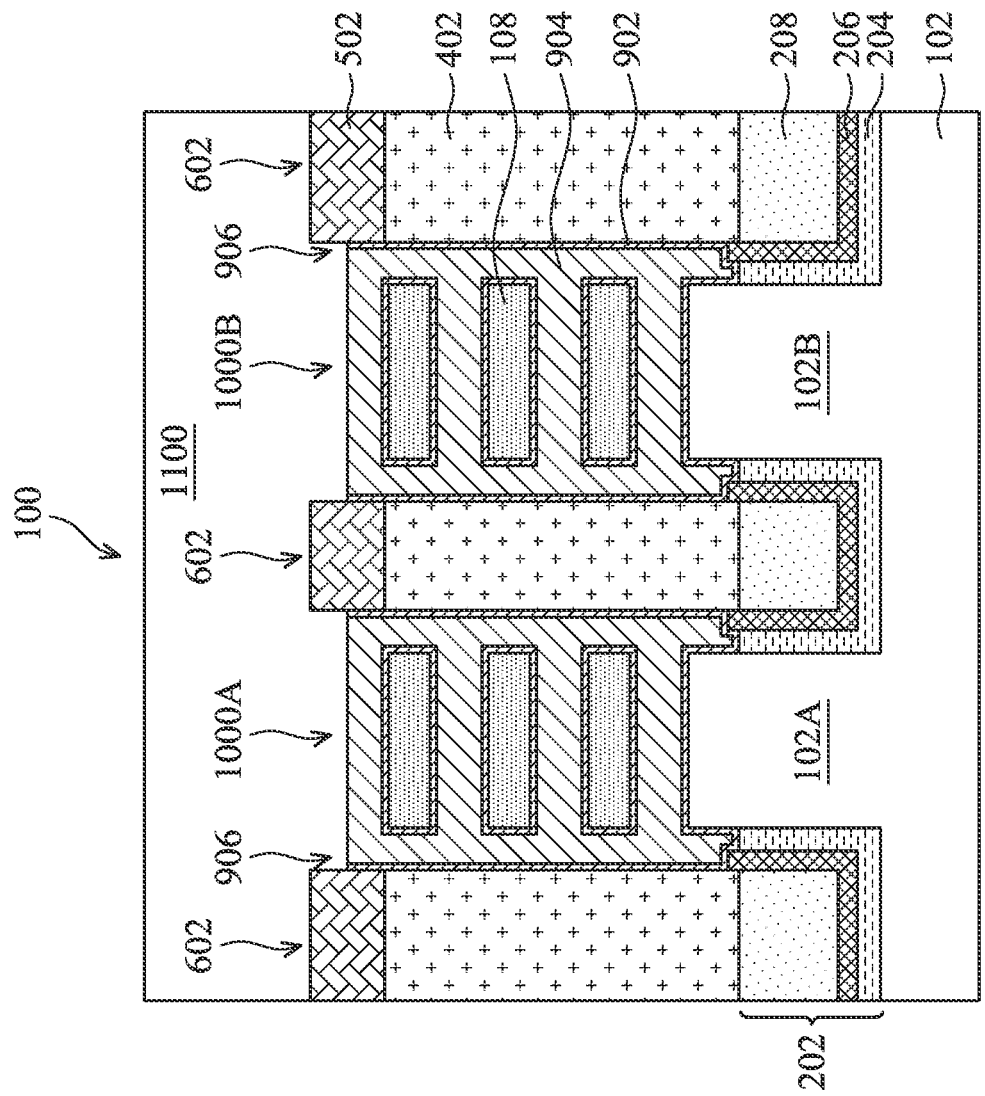

FIG. 2B shows a cross-sectional view after processes similar to those in FIGS. 1G to 1R are performed on the workpiece 100 of FIG. 2A. As shown in FIG. 2B, the sidewalls of the gate structures 906 and the isolation features 602 are aligned with the sidewalls of the dielectric material 208. In some embodiments, the liner layer 206 is in contact with the isolation features 602. More specifically, the sidewalls of the extending portions of the liner layer 206 are in contact with the sidewalls of the isolation features 602. Further, the gate structures 906 (more specifically, the gate dielectric layer 902) is in contact with the sidewalls of the extending portions of the liner layer 206.

Figure 3A:
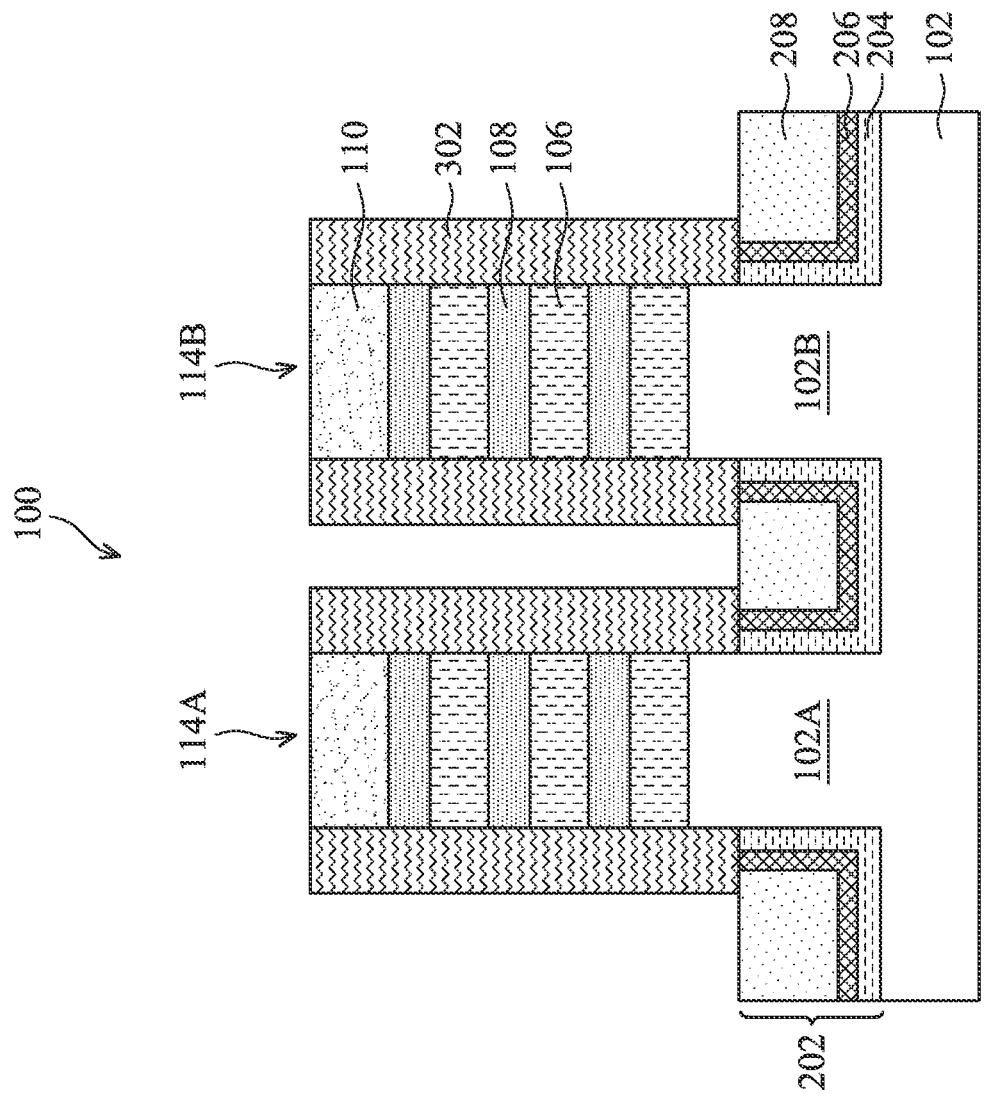
FIGS. 3A and 3B are cross-sectional views of an embodiment of a workpiece of the present disclosure constructed at the same fabrication stages as FIGS. 1H and 1R, respectively, in accordance with some embodiments.

FIG. 3A shows a cross-sectional view at the same fabrication stages as FIG. 1H. The thickness of the cladding layer is greater than the sum of the thicknesses of the liner layers 204 and 206. Therefore, in some embodiments, the sidewalls of the cladding layer 302 are directly over the dielectric material 208 of the isolation structures 202, as shown in FIG. 3A. In some aspects, the cladding layer 302 is in contact with the dielectric material 208 of the isolation structures 202.

Figure 3B:
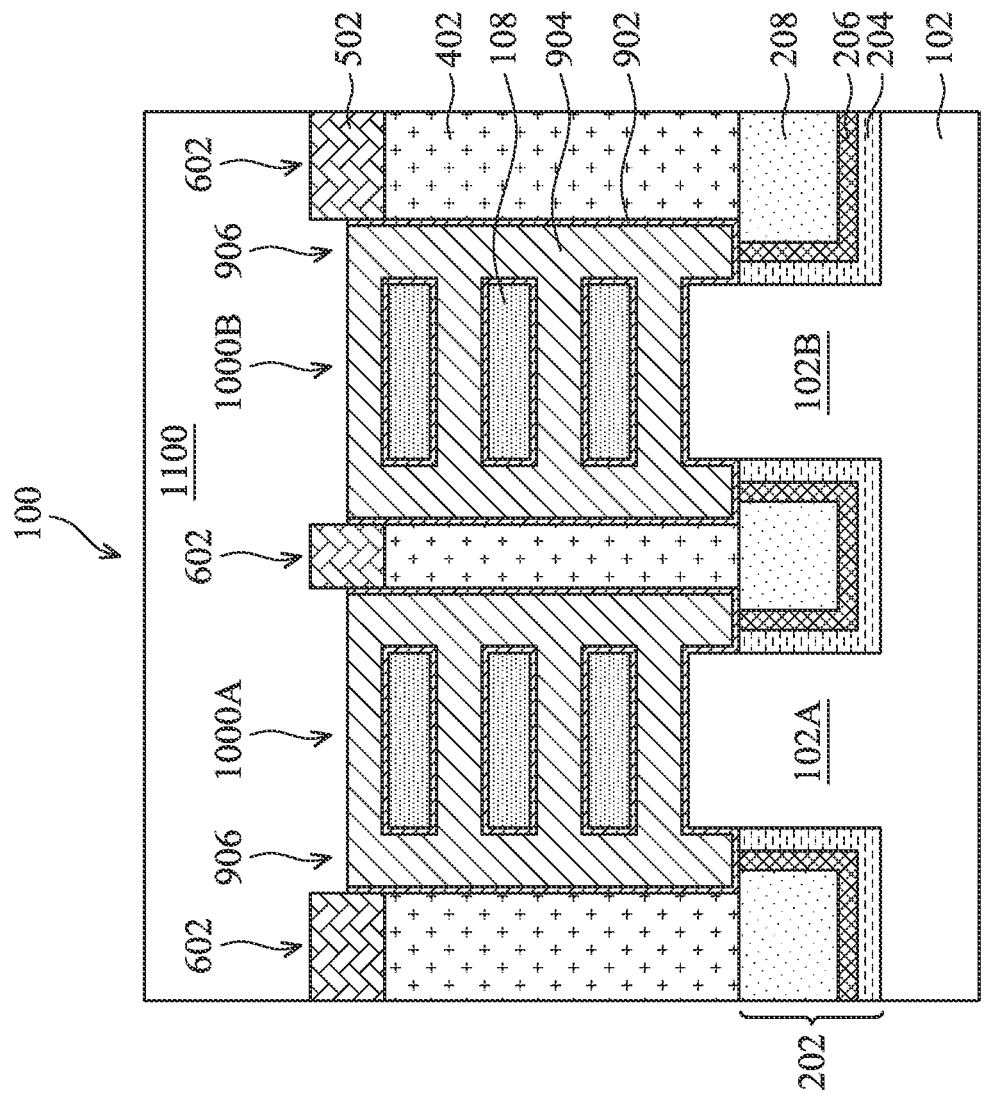

FIG. 3B shows a cross-sectional view after processes similar to those in FIGS. 1I to 1R are performed on the workpiece 100 of FIG. 3A. As shown in FIG. 3B, the sidewalls of the gate structures 906 and the isolation features 602 are directly over the dielectric material 208 of the isolation structures 202. In some embodiments, the gate structures 906 is in contact with the top surfaces of the dielectric material 208 of the isolation features 602. More specifically, the gate dielectric layer 902 of the gate structures 906 is on or in contact with the top surfaces of the dielectric material 208 of the isolation features 602.

Figure 4:
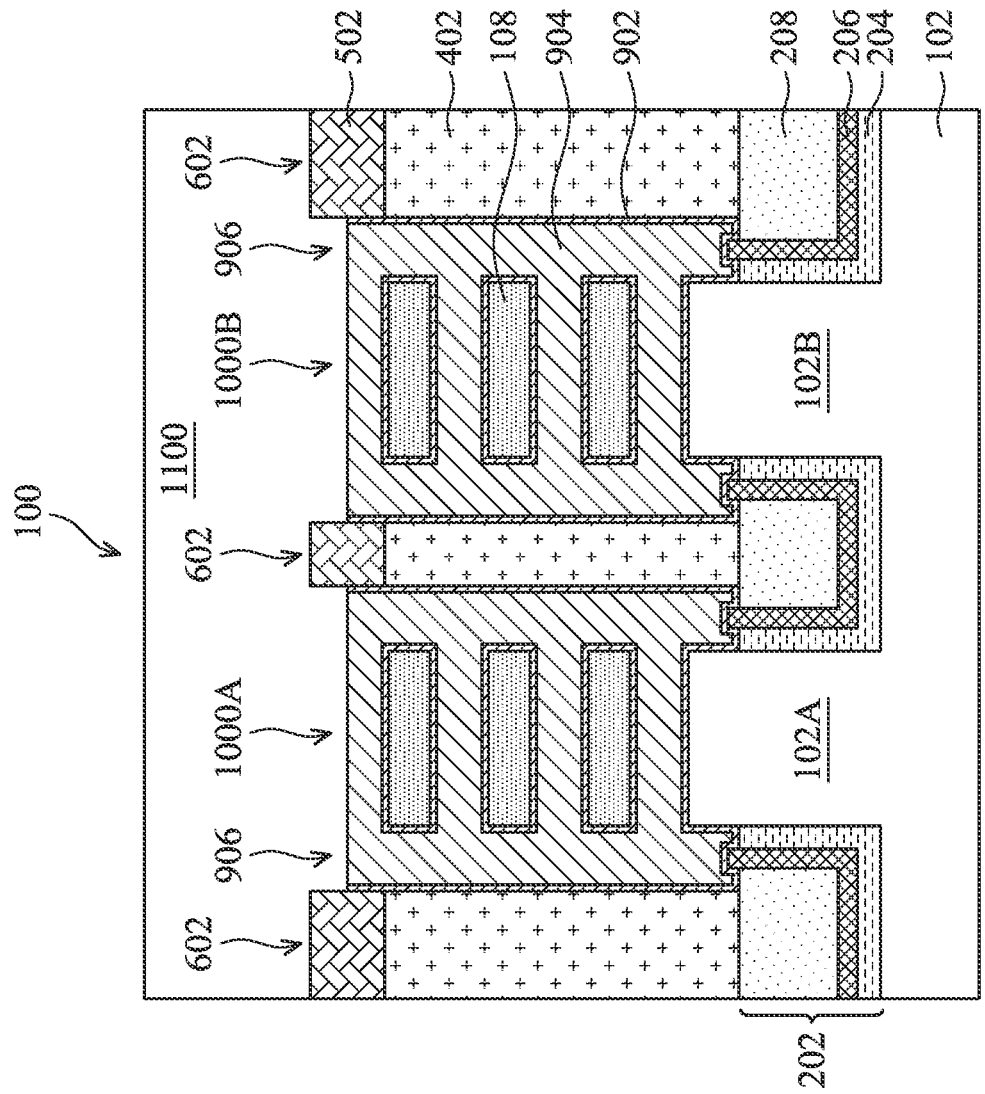
FIG. 4 is a cross-sectional view of an embodiment of a workpiece of the present disclosure constructed at the same fabrication stages as FIG. 1R, in accordance with some embodiments.

FIG. 4 shows a cross-sectional view of some alternative embodiments of the workpiece 100 of FIG. 1R. Similarly to FIG. 2B, the top surfaces of the liner layer 206 are higher than the top surfaces of the liner layer 204 and the dielectric material 208. In some aspects, the liner layer 206 has extending portions that are higher than the liner layer 204 and the dielectric material 208. More specifically, the liner layer 206 has the extending portions extending into the gate structure 906. The sidewalls of the extending portions of the liner layer 206 are in contact with the gate structures 906 (more specifically, the gate dielectric layer 902). Further, Similarly to FIG. 3B, the sidewalls of the gate structures 906 and the isolation features 602 are directly over the dielectric material 208 of the isolation structures 202. In some embodiments, the gate structures 906 (more specifically, the gate dielectric layer 902) are in contact with the top surfaces of the dielectric material 208 of the isolation features 602.

The embodiments disclosed herein relate to semiconductor structures and their manufacturing methods, and more particularly to semiconductor structures comprising isolation structures, in which each of the isolation structures has two liner layers. Furthermore, the present embodiments provide one or more of the following advantage. The two liner layers of the isolation structure have different etching rates during the etching process for forming the isolation structure. Therefore, the concave surface of the isolation structure is avoided. This may prevent undesired defects in the GAA device.

Thus, one of the embodiments of the present disclosure described a semiconductor structure including a fin structure protruded from a substrate, nanostructures over the fin structure, and an isolation structure arranged adjacent to the fin structure. The isolation structure includes a dielectric material, a doped oxide layer on sidewalls and a bottom surface of the dielectric material, and an oxide layer on sidewalls and a bottom surface of the doped oxide layer. The semiconductor structure further includes an isolation feature over the isolation structure and a gate structure over the fin structure and the isolation structure. The gate structure wraps around the nanostructures and is in contact with the isolation feature.

In some embodiments, the doped oxide layer and the oxide layer comprise silicon oxide. In some embodiments, the oxide layer and the doped oxide layer comprise the same dopants with different concentrations. In some embodiments, the semiconductor structure further includes a gate dielectric layer wrapping around the nanostructures, on a sidewall of the isolation feature, and on top surfaces of the doped oxide layer and the oxide layer, and a gate electrode wrapping around the gate dielectric layer. In some embodiments, the oxide layer and the doped oxide layer have the same thickness. In some embodiments, a sidewall of the isolation feature is aligned with a sidewall of the dielectric material. In some embodiments, a sidewall of the isolation feature is directly over the dielectric material. In some embodiments, a topmost surface of the doped oxide layer is higher than a topmost surface of the dielectric material.

In another of the embodiments, discussed is a semiconductor structure including a fin structure and nanostructures over the fin structure, a gate structure wrapping around the nanostructures, and an isolation structure under the gate structure and around the fin structure. The isolation structure includes a first liner layer on a sidewall of the fin structure, a second liner layer on a sidewall of the first liner layer, and a dielectric material over the second liner layer. The second liner layer has first dopants, and the first dopants comprise nitrogen, germanium, boron, or carbon.

In some embodiments, the first liner layer has second dopants. In some embodiments, the first dopants are different than the second dopants. In some embodiments, the gate structure is in direct contact with the first liner layer and the second liner layer. In some embodiments, a sidewall of the gate structure is aligned with a sidewall of the dielectric material. In some embodiments, a sidewall of the gate structure is directly over the dielectric material. In some embodiments, the second liner layer has an extending portion extending into the gate structure.

In yet another of the embodiments, discussed is a method for manufacturing a semiconductor structure that includes forming fins over a substrate. The fins each includes first semiconductor layers and second semiconductor layers alternatingly stacked. The method further includes forming a first liner layer on sidewalls of the fins and over the substrate, forming a second liner layer having first dopants on sidewalls of the first liner layer and over the first liner layer, forming a dielectric material between sidewalls of the second liner layer, and etching the first liner layer, the second liner layer, and the dielectric material to form an isolation structure between the fins. In some embodiments, the method further includes forming a cladding layer on sidewalls of the fins and over the isolation structure, forming source/drain features in the fins, removing the second semiconductor layers and the cladding layer to form gate trenches, and forming gate structures in the gate trenches and wrapping around the first semiconductor layers.

In some embodiments, the first liner layer and the second liner layer are formed by performing atomic layer deposition processes. In some embodiments, an etching rate of the first liner layer is greater than an etching rate of the second liner layer during the etching of the first liner layer, the second liner layer, and the dielectric material. In some embodiments, the source/drain features are in contact with top surfaces of the first liner layer and the second liner layer. In some embodiments, the source/drain features are in contact with sidewalls of the second liner layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a fin structure protruded from a substrate;
nanostructures over the fin structure;
an isolation structure arranged adjacent to the fin structure, wherein the isolation structure comprises:
a dielectric material;
a doped oxide layer on sidewalls and a bottom surface of the dielectric material;
an oxide layer on sidewalls and a bottom surface of the doped oxide layer; and
an isolation feature over the isolation structure, wherein the isolation feature is separated from the doped oxide layer and the oxide layer; and
a gate structure over the fin structure and the isolation structure, wherein the gate structure wraps around the nanostructures and is in contact with the isolation feature.

2. The semiconductor structure of claim 1, wherein the doped oxide layer and the oxide layer comprise silicon oxide.

3. The semiconductor structure of claim 1, wherein the oxide layer and the doped oxide layer comprise the same dopants with different concentrations.

4. The semiconductor structure of claim 1, further comprising:
a gate dielectric layer wrapping around the nanostructures, on a sidewall of the isolation feature, and on top surfaces of the doped oxide layer and the oxide layer; and
a gate electrode wrapping around the gate dielectric layer.

5. The semiconductor structure of claim 1, wherein the oxide layer and the doped oxide layer have the same thickness.

6. The semiconductor structure of claim 1, wherein a sidewall of the isolation feature is aligned with a sidewall of the dielectric material.

7. The semiconductor structure of claim 1, wherein a sidewall of the isolation feature is directly over the dielectric material.

8. The semiconductor structure of claim 1, wherein a topmost surface of the doped oxide layer is higher than a topmost surface of the dielectric material.

9. A semiconductor structure, comprising:
a fin structure and nanostructures over the fin structure;
a gate structure wrapping around the nanostructures; and
an isolation structure under the gate structure and around the fin structure, wherein the isolation structure comprises:
a first liner layer on a sidewall of the fin structure;
a second liner layer on a sidewall of the first liner layer, wherein the second liner layer has first dopants, and the first dopants comprise nitrogen, germanium, or boron, er carbon; and
a dielectric material over the second liner layer.

10. The semiconductor structure of claim 9, wherein the first liner layer has second dopants.

11. The semiconductor structure of claim 10, wherein the first dopants are different than the second dopants.

12. The semiconductor structure of claim 9, wherein the gate structure is in direct contact with the first liner layer and the second liner layer.

13. The semiconductor structure of claim 9, wherein a sidewall of the gate structure is aligned with a sidewall of the dielectric material.

14. The semiconductor structure of claim 9, wherein a sidewall of the gate structure is directly over the dielectric material.

15. The semiconductor structure of claim 9, wherein the second liner layer has an extending portion extending into the gate structure.

16. A semiconductor structure, comprising:
a first gate-all-around device, comprising:
a first fin structure protruded from a substrate;
first nanostructures over the first fin structure; and
a first gate structure over the first fin structure and wrapping around the nanostructures;
a second gate-all-around device, comprising:
a second fin structure protruded from the substrate;
second nanostructures over the second fin structure; and
a second gate structure over the second fin structure and wrapping around the second nanostructures;
an isolation structure between and the first fin structure and the second fin structure, wherein the isolation structure comprises:
a first liner layer over the substrate and on sidewalls of the first fin structure and the second fin structure;
a second liner layer on sidewalls and a top surface of the first line layer, wherein the second liner layer has first dopants; and
a dielectric material on sidewalls and a top surface of the second liner layer; and
an isolation feature over the isolation structure, wherein a top surface of the isolation feature is higher than top surfaces of the first gate structure and the second gate structure.

17. The semiconductor structure of claim 16, wherein the first liner layer has the first dopants, wherein the first dopants in the first liner layer and the first dopants in the second liner layer have different concentrations.

18. The semiconductor structure of claim 16, wherein the first liner layer has second dopants different than the second dopants.

19. The semiconductor structure of claim 16, wherein the first liner layer and the second liner layer are formed by atomic layer deposition processes.

20. The semiconductor structure of claim 16, wherein the second liner layer is in contact with sidewalls of the isolation feature.

* * * * *